(12) United States Patent
Liu et al.

(10) Patent No.: US 12,266,642 B2
(45) Date of Patent: Apr. 1, 2025

(54) LIGHT-EMITTING SUBSTRATE, BACKLIGHT, DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Chunjian Liu, Beijing (CN); Zouming Xu, Beijing (CN); Jian Tian, Beijing (CN); Xintao Wu, Beijing (CN); Jie Lei, Beijing (CN); Jie Wang, Beijing (CN); Jianying Zhang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 422 days.

(21) Appl. No.: 17/757,792

(22) PCT Filed: Jul. 30, 2021

(86) PCT No.: PCT/CN2021/109826
§ 371 (c)(1),
(2) Date: Jun. 21, 2022

(87) PCT Pub. No.: WO2023/004797
PCT Pub. Date: Feb. 2, 2023

(65) Prior Publication Data
US 2023/0034742 A1    Feb. 2, 2023

(51) Int. Cl.
*H01L 25/075*      (2006.01)
*H10D 8/60*        (2025.01)
(Continued)

(52) U.S. Cl.
CPC ....... *H01L 25/0753* (2013.01); *H10D 89/921* (2025.01)

(58) Field of Classification Search
CPC ................ H01L 27/0292; H01L 33/62; G09G 2310/0281; G09G 2300/0426; G09G 2310/0218; G09G 3/3685; G09G 3/3677
See application file for complete search history.

(56) References Cited

U.S. PATENT DOCUMENTS

2004/0108977 A1    6/2004    Hirayama
2005/0001858 A1    1/2005    Morita et al.
(Continued)

FOREIGN PATENT DOCUMENTS

CN        1551062 A    12/2004
CN    110767731 A     2/2020
(Continued)

OTHER PUBLICATIONS

International Search Report and Written Opinion received for PCT Patent Application No. PCT/CN2021/109826, mailed on Apr. 27, 2022, 11 pages of Original Document Only.
(Continued)

*Primary Examiner* — Sonya McCall-Shepard
(74) *Attorney, Agent, or Firm* — Calfee, Halter & Griswold LLP

(57) ABSTRACT

The present disclosure provides a light-emitting substrate, a backlight and a display device. The light-emitting substrate includes a light-emitting region and a peripheral region surrounding the light-emitting region. The peripheral region includes a first area, the first area is located between a first side of the light-emitting substrate and the light-emitting region, the light-emitting substrate further includes a first signal line, the first signal line includes at least one selected from a group consisting of a first portion and a second
(Continued)

portion, the first portion of the first signal line extends along a first direction in the first area, the second portion of the first signal line extends into the light-emitting region, the first portion and the second portion of the first signal line are connected when the first signal line includes the first portion and the second portion.

19 Claims, 11 Drawing Sheets

(51) Int. Cl.
*H10D 30/01* (2025.01)
*H10D 89/60* (2025.01)

(56) References Cited

U.S. PATENT DOCUMENTS

| | | |
|---|---|---|
| 2007/0296677 A1 | 12/2007 | Morita et al. |
| 2014/0043306 A1* | 2/2014 | Min ..................... G09G 3/3677 |
| | | 345/204 |
| 2014/0239823 A1 | 8/2014 | Ahn |

FOREIGN PATENT DOCUMENTS

| | | |
|---|---|---|
| CN | 110796980 A | 2/2020 |
| CN | 111462687 A | 7/2020 |
| CN | 111952343 A | 11/2020 |
| CN | 113160745 A | 7/2021 |
| WO | 2021/092875 A1 | 5/2021 |

OTHER PUBLICATIONS

First Office Action of Chinese patent application No. 202180002034.2 dated Oct. 31, 2024.

\* cited by examiner

LIGHT-EMITTING SUBSTRATE, BACKLIGHT, DISPLAY DEVICE

RELATED APPLICATIONS

The present application is a 35 U.S.C. 371 national stage application of PCT International Application No. PCT/CN2021/109826 filed on Jul. 30, 2021, the entire disclosure of which is incorporated herein by reference.

TECHNICAL FIELD

The present disclosure relates to the field of optical technology, and in particular, to a light-emitting substrate, a backlight comprising the light-emitting substrate, and a display device comprising the light-emitting substrate.

BACKGROUND

With the continuous development of display technology, users have put forward higher and higher requirements on the contrast, luminance uniformity and stability of the display device. Display devices are generally divided into two types: liquid crystal display devices and organic light-emitting diode display devices. The liquid crystal display device is widely used due to its advantages of thinness, good shock resistance, wide viewing angle and high contrast. A liquid crystal display device generally comprises a display panel and a backlight, and the backlight is usually provided on a non-display side of the display panel to provide a light source for display of the display panel. The characteristics of the liquid crystal display device, such as contrast, luminance uniformity, and stability, are related to the structure and performance of the backlight.

SUMMARY

According to an aspect of the present disclosure, a light-emitting substrate is provided. The light-emitting substrate comprises a light-emitting region and a peripheral region surrounding the light-emitting region; the peripheral region comprises a first area, the first area is between a first side of the light-emitting substrate and the light-emitting region, and the light-emitting substrate further comprises a first signal line, the first signal line comprises at least one selected from a group consisting of a first portion and a second portion, the first portion of the first signal line extends along a first direction in the first area, the second portion of the first signal line extends into the light-emitting region, the first portion and the second portion of the first signal line are connected when the first signal line comprises the first portion and the second portion.

In some embodiments, the peripheral region further comprises a second area, the second area is between a second side of the light-emitting substrate opposite to the first side and the light-emitting region, and the light-emitting substrate further comprises a second signal line, a first portion of the second signal line extends along the first direction in the second area, a second portion of the second signal line extends into the light-emitting region, and the first portion and the second portion of the second signal line are connected.

In some embodiments, the second portion of the first signal line comprises at least one strip-like structure extending along the first direction, the first portion and the second portion of the first signal line are connected via a third portion of the first signal line; and/or the second portion of the second signal line comprises at least one strip-like structure extending along the first direction, the first portion and the second portion of the second signal line are connected via a third portion of the second signal line.

In some embodiments, the light-emitting region comprises a plurality of sub-light-emitting regions arranged in an array, and the plurality of sub-light-emitting regions are arranged in M rows along the first direction and N columns along a second direction intersecting with the first direction, where M and N are both positive integers greater than or equal to 1. The first portion of the first signal line is arranged between the first column of sub-light-emitting regions and the first side of the light-emitting substrate, each of the at least one strip-like structure of the second portion of the first signal line is arranged in a corresponding column of the $1^{st}$ to $X^{th}$ columns of sub-light-emitting regions. Each of the at least one strip-like structure of the second portion of the second signal line is arranged in a corresponding column of the $Y^{th}$ to $N^{th}$ columns of sub-light-emitting regions, and the first portion of the second signal line is arranged between the $N^{th}$ column of sub-light-emitting regions and the second side of the light-emitting substrate, where $1 \leq X < Y \leq N$.

In some embodiments, the light-emitting substrate further comprises a first conductive portion on a same layer as the first signal line. The first conductive portion comprises N−1 driving voltage signal lines extending along the first direction, each column of the $2^{nd}$ to $N^{th}$ columns of sub-light-emitting regions comprises one driving voltage signal line, each of the plurality of sub-light-emitting regions comprises at least one light-emitting unit, in each column of the $2^{nd}$ to $N^{th}$ columns of sub-light-emitting regions, the driving voltage signal line is connected to a first end of each light-emitting unit in the column of sub-light-emitting regions, and, the first portion of the first signal line is connected to the first end of each light-emitting unit in the first column of sub-light-emitting regions.

In some embodiments, a width of the first portion of the first signal line along the second direction is smaller than a width of each driving voltage signal line along the second direction.

In some embodiments, the light-emitting substrate further comprises a second conductive portion. The second conductive portion comprises a plurality of pads.

In some embodiments, the first conductive portion and the second conductive portion are on a same layer.

In some embodiments, the first conductive portion further comprises N−1 common voltage signal lines extending along the first direction, and the first conductive portion and the second signal line are on a same layer. Each column of the $1^{st}$ to $(N-1)^{th}$ columns of sub-light-emitting regions comprises one common voltage signal line, each of the plurality of sub-light-emitting regions further comprises a driving circuit connected to a second end of the at least one light-emitting unit, in each column of the $1^{st}$ to $(N-1)^{th}$ columns of sub-light-emitting regions, the common voltage signal line is connected to each driving circuit in the column of sub-light-emitting regions, and the first portion of the second signal line is connected to each driving circuit in the Nth column of sub-light-emitting regions.

In some embodiments, a width of the first portion of the second signal line along the second direction is smaller than a width of each common voltage signal line along the second direction.

In some embodiments, in each column of the 2nd to (N−1)th columns of sub-light-emitting regions, the driving voltage signal line, the light-emitting unit, the driving circuit, and the common voltage signal line are sequentially arranged along the second direction.

In some embodiments, the first conductive portion further comprises N feedback signal lines extending along the first direction, each column of sub-light-emitting regions comprises one feedback signal line. In each column of sub-light-emitting regions, the driving circuits are cascaded in sequence, the feedback signal line is connected to a last-cascaded driving circuit. In at least some columns of the N columns of sub-light-emitting regions, the feedback signal line is on a side of the common voltage signal line away from the driving circuit, the common voltage signal line is in the same column of sub-light-emitting regions as the feedback signal line.

In some embodiments, in each column of the 1st to Xth columns of sub-light-emitting regions, the feedback signal line is on the side of the common voltage signal line away from the driving circuit, the common voltage signal line is in the same column of sub-light-emitting regions as the feedback signal line; and in each column of the Yth to Xth columns of sub-light-emitting regions, the feedback signal line is on a side of the driving voltage signal line away from the driving circuit, the driving voltage signal line is in the same column of sub-light-emitting regions as the feedback signal line.

In some embodiments, the light-emitting substrate further comprises a base substrate, a buffer layer and an insulating layer. The buffer layer is between a layer where the first conductive portion and the second conductive portion are located and the base substrate, and the insulating layer is on a side of the layer where the first conductive portion and the second conductive portion are located away from the base substrate.

In some embodiments, the light-emitting substrate further comprises a bonding electrode in the peripheral region. The bonding electrode comprises a valid terminal and a dummy terminal, the first portion and the second portion of the first signal line, the first portion and the second portion of the second signal line, and the first conductive portion are connected to the valid terminals of the bonding electrode.

In some embodiments, the common voltage signal line comprises a first connection portion, the driving voltage signal line comprises a second connection portion, the common voltage signal line is connected to the valid terminal of the bonding electrode through the first connection portion, the driving voltage signal line is connected to the valid terminal of the bonding electrode through the second connection portion; the first connection portion of the common voltage signal line in each column of the $1^{st}$ to $(N-1)^{th}$ columns of sub-light-emitting regions is only in the column of sub-light-emitting regions; the second connection portion of the driving voltage signal line in each column of the $2^{nd}$ to $N^{th}$ columns of sub-light-emitting regions is only in the column of sub-light-emitting regions.

In some embodiments, the light-emitting substrate further comprises a base substrate. The first conductive portion and the second conductive portion are in different layers, the first conductive portion is on the base substrate, the second conductive portion is on a side of the first conductive portion away from the base substrate.

In some embodiments, the light-emitting region comprises a plurality of sub-light-emitting regions arranged in an array, the plurality of sub-light-emitting regions are arranged in M rows along the first direction and N columns along a second direction intersecting with the first direction, where M and N are both positive integers greater than or equal to 1. The first signal line comprises the second portion, the second portion of the first signal line comprises a plurality of sub-signal lines extending along the first direction, each column of the N columns of sub-light-emitting regions comprises one sub-signal line.

In some embodiments, each of the plurality of sub-light-emitting regions comprises at least one light-emitting unit, each of the at least one light-emitting unit comprises a plurality of light-emitting elements connected to each other, the sub-signal line in the first column of sub-light-emitting regions is on a side of at least some of the plurality of light-emitting elements of each light-emitting unit in the column of sub-light-emitting regions away from the first side of the light-emitting substrate, the sub-signal line in the Nth column of sub-light-emitting regions is on a side of at least some of the plurality of light-emitting elements of each light-emitting unit in the column of sub-light-emitting regions away from a second side of the light-emitting substrate, the second side is opposite to the first side.

In some embodiments, a material of the first conductive portion and the second conductive portion comprises copper.

In some embodiments, the light-emitting substrate further comprises a shielding ring. The shielding ring at least partially surrounds a periphery of the light-emitting region, and a signal received by the shielding ring is the same as a signal received by the common voltage signal line.

In some embodiments, each of the at least one light-emitting unit comprises a plurality of light-emitting elements connected to each other, each of the plurality of light-emitting elements comprises a sub-millimeter light emitting diode or a micro light emitting diode.

According to another aspect of the present disclosure, a backlight comprising the light-emitting substrate described in any of the preceding embodiments is provided.

According to yet another aspect of the present disclosure, a display device comprising the light-emitting substrate described in any of the preceding embodiments is provided.

BRIEF DESCRIPTION OF THE DRAWINGS

In order to describe the technical solutions in the embodiments of the present disclosure more clearly, the accompanying drawings required in the embodiments will be briefly introduced below. Obviously, the drawings described in the following are only some embodiments of the present disclosure. For those of ordinary skill in the art, other drawings can also be obtained from these drawings without any creative effort.

DETAILED DESCRIPTION OF THE DISCLOSURE

Figure 1:
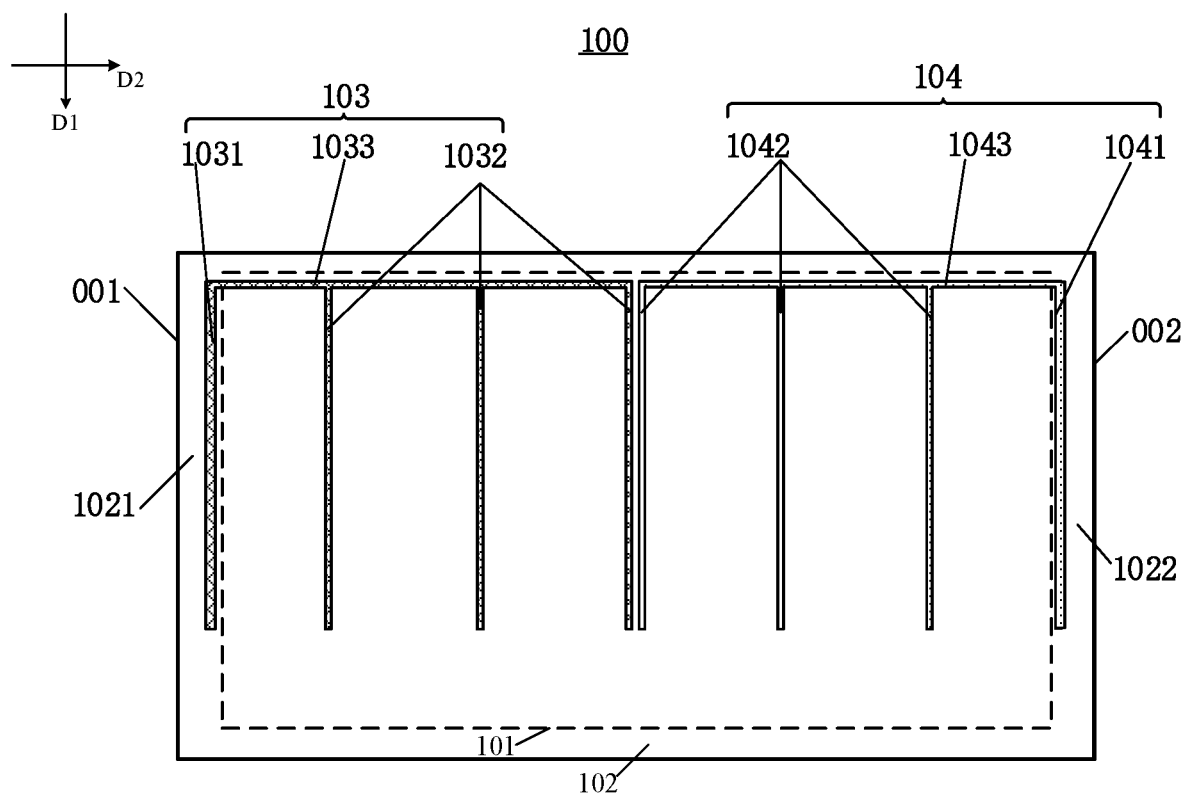
FIG. 1 illustrates a schematic diagram of the arrangement of a first signal line and a second signal line of a light-emitting substrate provided according to an embodiment of the present disclosure.

The technical solutions in the embodiments of the present disclosure will be clearly and completely described below with reference to the accompanying drawings in the embodiments of the present disclosure. Obviously, the described embodiments are only some, but not all, embodiments of the present disclosure. Based on the embodiments in the present disclosure, all other embodiments obtained by those of ordinary skill in the art without creative efforts shall fall within the protection scope of the present disclosure.

It can be understood that, the various drawings in the embodiments of the present disclosure are only used to schematically illustrate the connection relationship between the various components, the dimensions of the various components in the drawings are not drawn to scale, and their relative positional relationship does not necessarily correspond exactly to the actual position. In the drawings, the scale of certain regions and layers may be exaggerated for clarity.

With the continuous development of display technology, in order to enable users to obtain a better visual experience, higher requirements are placed on the screen ratio of the display device, which requires the display device to have a narrower frame. Signal lines are usually arranged near two side edges (e.g., left and right edges of the display device when a user faces the display device) of the substrate of the display device. In the related art, in order to realize a narrow frame, the signal lines near the edges of both sides of the substrate are usually designed to have a narrow width. However, the signal line with a narrower width will cause the signal line to have a larger resistance and a larger voltage drop, which will affect the luminous efficiency of the display device, and make the luminance of the central area and the edge areas on both sides of the display device uneven. In order to solve the large resistance and large voltage drop caused by the narrow width of the signal line, the resistance and the voltage drop of the signal line are usually reduced by increasing the thickness of the signal line, but this greatly increases the material consumption of the signal line and the process, thereby increasing the production cost and reducing the production efficiency.

In order to solve the technical problems existing in the related art, the embodiments of the present disclosure provide a light-emitting substrate, and FIG. 1 illustrates a schematic diagram of the arrangement of the light-emitting substrate 100. It should be noted that, in order to clearly illustrate the arrangement of a first signal line 103 (and a second signal line 104), other components of the light-emitting substrate 100 are omitted in FIG. 1. As illustrated in FIG. 1, the light-emitting substrate 100 comprises a light-emitting region 101 and a peripheral region 102 surrounding the light-emitting region 101. The peripheral region 102 comprises a first area 1021 located between the first side 001 of the light-emitting substrate 100 and the light-emitting region 101. The light-emitting substrate 100 further comprises a first signal line 103, the first signal line 103 comprises at least one selected from a group consisting of a first portion 1031 and a second portion 1032, and the first portion 1031 of the first signal line 103 extends along the first direction D1 in the first area 1021, the second portion 1032 of the first signal line 103 extends into the light-emitting region 101. When the first signal line 103 comprises the first portion 1031 and the second portion 1032, the first portion 1031 and the second portion 1032 of the first signal line 103 are connected.

It should be noted that although FIG. 1 illustrates that the first signal line 103 comprises the first portion 1031 and the second portion 1032, as stated in "the first signal line 103 comprises at least one selected from a group consisting of the first portion 1031 and the second portion 1032", the first signal line 103 may comprise only the first portion 1031, or only the second portion 1032, or both the first portion 1031 and the second portion 1032.

The first portion 1031 of the first signal line 103 is located between the first side 001 of the light-emitting substrate 100 and the light-emitting region 101. In other words, the first portion 1031 of the first signal line 103 is located in the frame area of the light-emitting substrate 100, that is, the left frame area of the light-emitting substrate 100 in FIG. 1. The first signal line 103 may be various appropriate types of signal lines, such as a signal line for transmitting voltage, a signal line for transmitting driving data, a wiring for connecting two or more components, and the like. The type of the first signal line 103 is not particularly limited in the embodiments of the present disclosure.

When the first signal line 103 comprises the first portion 1031 and the second portion 1032, by making the first portion 1031 of the first signal line 103 be located in the first area 1021 of the peripheral region 102 and the second portion 1032 connected to the first portion 1031 of the first signal line 103 extend into the light-emitting region 101, the first portion 1031 of the first signal line 103 can be designed to have a narrower width in the second direction D2, so that it is beneficial to reduce the width of the first area 1021 along the second direction D2, that is, it is beneficial to reduce the width of the left frame of the light-emitting substrate 100. Since the second portion 1032 connected to the first portion 1031 extends into the light-emitting region 101, it is equivalent to "dividing" the width of the first signal line 103 along the second direction D2 into two portions: a portion of the width (that is, the width of the first portion 1031 of the first signal line 103) is located in the first area 1021 of the peripheral region 102, and a portion of the width (that is, the width of the second portion 1032 of the first signal line 103) is located in the light-emitting region 101. As such, even if the width of the first portion 1031 of the first signal line 103 is reduced, due to the existence of the second portion 1032, the resistance and the voltage drop of the first signal line 103 will not increase, thus not affecting the luminous efficiency of the light-emitting substrate 100, and making the central area and the edge area of the light-emitting substrate 100 have uniform luminance. In addition, with this arrangement, there is no need to increase the thickness of the first signal line 103, so the production cost can be reduced and the production efficiency can be improved.

As illustrated in FIG. 1, the peripheral region 102 further comprises a second area 1022 located between the second side 002 of the light-emitting substrate 100 opposite to the first side 001 and the light-emitting region 101. Optionally, the light-emitting substrate 100 may further comprise a second signal line 104, the first portion 1041 of the second signal line 104 extends along the first direction D1 in the second area 1022, and the second portion 1042 of the second signal line 104 extends into the light-emitting region 101, and the first portion 1041 and the second portion 1042 of the second signal line 104 are connected.

The first portion 1041 of the second signal line 104 is located between the second side 002 of the light-emitting substrate 100 and the light-emitting region 101. In other words, the first portion 1041 of the second signal line 104 is located in the frame area of the light-emitting substrate 100, that is, the right frame area of the light-emitting substrate 100 in FIG. 1. Similar to the first signal line 103, the second signal line 104 may be various appropriate types of signal lines, such as a signal line for transmitting voltage, a signal line for transmitting driving data, a wiring connecting two or more components, etc. The embodiments of the present disclosure do not specifically limit the type of the second signal line 104.

In some embodiments, the second portion 1032 of the first signal line 103 comprises at least one strip-like structure 1034 extending along the first direction D1, and the first portion 1031 and the second portion 1032 of the first signal line 103 are connected via a third portion 1033 of the first signal line 103. The first portion 1031, the second portion 1032 and the third portion 1033 of the first signal line 103 make the first signal line 103 have a "comb" shape. In some embodiments, the second portion 1042 of the second signal line 104 comprises at least one strip-like structure 1044 extending along the first direction D1, and the first portion 1041 and the second portion 1042 of the second signal line 104 are connected via a third portion 1043 of the second signal line 104. The first portion 1041, the second portion 1042 and the third portion 1043 of the second signal line 104 make the second signal line 104 have a "comb" shape. Of course, the shapes of the first signal line 103 and the second signal line 104 are not limited to the "comb" shape, and can also be any other appropriate shape. For example, when the second portion 1032 of the first signal line 103 comprises one strip-like structure 1034, the first signal line 103 has a "U" shape. When the second portion 1042 of the second signal line 104 comprises one strip-like structure 1044, the second signal line 104 has a "U" shape. The embodiments of the present disclosure do not specifically limit the shapes of the first signal line 103 and the second signal line 104.

Similar to the first signal line 103, by making the first portion 1041 of the second signal line 104 be located in the second area 1022 of the peripheral region 102 and the second portion 1042 connected to the first portion 1041 of the second signal line 104 extend into the light-emitting region 101, the first portion 1041 of the second signal line 104 can be designed to have a narrower width in the second direction D2, so that it is beneficial to reduce the width of the second area 1022 along the second direction D2, that is, it is beneficial to reduce the width of the right frame of the light-emitting substrate 100. Since the second portion 1042 connected to the first portion 1041 extends into the light-emitting region 101, even if the width of the first portion 1041 of the second signal line 104 is reduced, due to the existence of the second portion 1042, the resistance and the voltage drop of the second signal line 104 will not increase. Therefore, the luminous efficiency of the light-emitting substrate 100 is not affected, and the central area and the edge area of the light-emitting substrate 100 have uniform luminance. In addition, with this arrangement, there is no need to increase the thickness of the second signal line 104, so the production cost can be reduced and the production efficiency can be improved.

The arrangement of the first signal line 103 and the second signal line 104 is beneficial to reduce the width of the first area 1021 and the second area 1022, thereby facilitating the realization of the left narrow frame and the right narrow frame of the light-emitting substrate 100. In addition, the existing large-sized light-emitting substrate is usually formed by splicing several small-sized light-emitting substrates. If the light-emitting substrate has a wide frame, when the multiple light-emitting substrates are spliced, due to the excessively large seams, it is easy to cause poor optical effect and inability to match various mechanisms. In contrast, the light-emitting substrate 100 of the present application has a narrow frame, so when a plurality of light-emitting substrates 100 are spliced to form a larger-sized light-emitting substrate, the plurality of light-emitting substrates 100 can be perfectly spliced without producing oversized seams between each other, so that the optical effect of the large-sized light-emitting substrate and the matching of various mechanisms can be improved.

Figure 2:
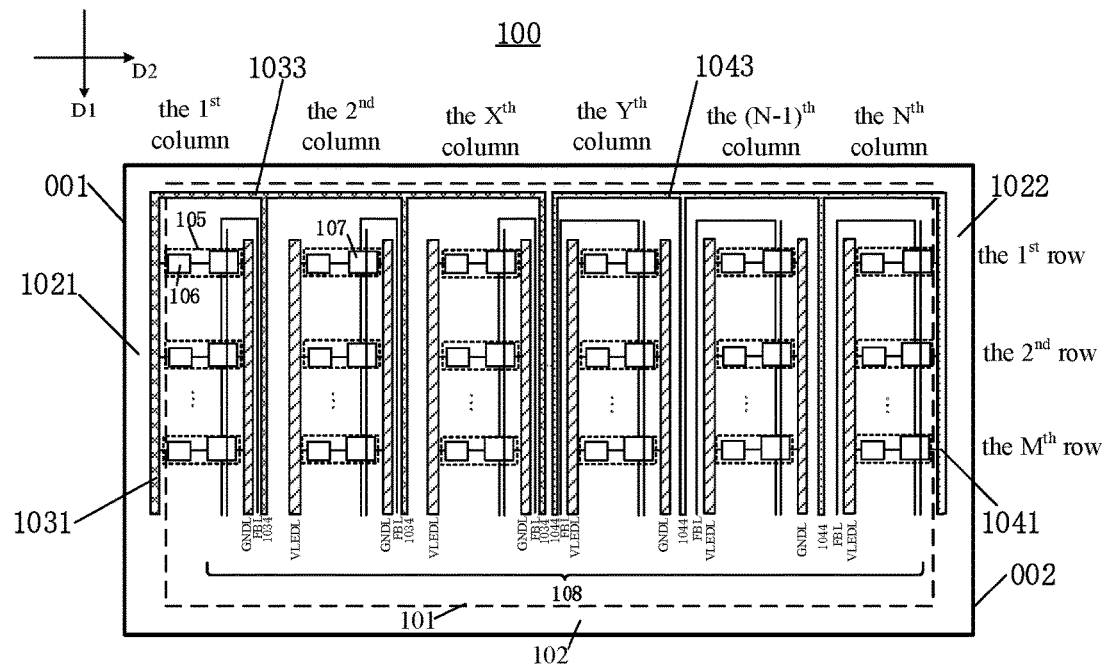
FIG. 2 illustrates a schematic diagram of the arrangement of a light-emitting substrate provided according to an embodiment of the present disclosure.

FIG. 2 illustrates a more detailed wiring of the light-emitting substrate 100. As illustrated in FIG. 2, the light-emitting region 101 comprises a plurality of sub-light-emitting regions 105 arranged in an array, and the plurality of sub-light-emitting regions 105 are arranged in M rows along the first direction D1 and N columns along the second direction D2 intersecting with the first direction D1, M and N are positive integers greater than or equal to 1. The first direction D1 may be a column direction, the second direction D2 may be a row direction, and the first direction D1 and the second direction D2 may be perpendicular to each other. The first portion 1031 of the first signal line 103 is arranged between the first column of sub-light-emitting regions and the first side 001 of the light-emitting substrate 100, that is, the first portion 1031 of the first signal line 103 is located in the first area 1021 of the peripheral region 102 and is outside the first column of sub-light-emitting regions. Each strip-like structure 1034 of the second portion 1032 of the first signal line 103 is arranged in a corresponding column of the $1^{st}$ to $X^{th}$ columns of sub-light-emitting regions, where $1 \leq X < N$. For example, when the second portion 1032 of the first signal line 103 comprises one strip-like structure 1034, $X=1$, and the one strip-like structure 1034 is arranged in the first column of sub-light-emitting regions. When the second portion 1032 of the first signal line 103 comprises two strip-like structures 1034, $X=2$, and the two strip-like structures 1034 are respectively arranged in the first column of sub-light-emitting regions and the second column of sub-light-emitting regions. When the second portion 1032 of the first signal line 103 comprises three strip-like structures 1034, X=3, and the three strip-like structures 1034 are respectively arranged in the first column of sub-light-emitting regions, the second column of sub-light-emitting regions and the third column of sub-light-emitting regions. By analogy, when the second portion 1032 of the first signal line 103 comprises X strip-like structures 1034, the X strip-like structures 1034 are respectively arranged in the first to $X^{th}$ columns of sub-light-emitting regions. As shown in the figure, each strip-like structure 1034 is located at the rightmost in the corresponding column of sub-light-emitting regions. For example, the strip-like structure 1034 in the first column of sub-light-emitting regions is located at the rightmost in the first column of sub-light-emitting regions.

Each strip-like structure 1044 of the second portion 1042 of the second signal line 104 is arranged in a corresponding column of the $Y^{th}$-$N^{th}$ columns of sub-light-emitting regions, and the first portion 1041 of the second signal line 104 is arranged between the Nth column of sub-light-emitting regions and the second side 002 of the light-emitting substrate 100, that is, the first portion 1041 of the second signal line 104 is located in the second area 1022 of the peripheral region 102 and is outside the $N^{th}$ column of sub-light-emitting regions, where $1 \leq X < Y \leq N$. For example, when the second portion 1042 of the second signal line 104 comprises one strip-like structure 1044, X=1, and the one strip-like structure 1044 is arranged in the $N^{th}$ column of sub-light-emitting regions. When the second portion 1042 of the second signal line 104 comprises two strip-like structures 1044, X=2, and the two strip-like structures 1044 are respectively arranged in the $N^{th}$ column of sub-light-emitting regions and the $(N-1)^{th}$ column of sub-light-emitting regions. When the second portion 1042 of the second signal line 104 comprises three stripe-like structures 1044, X=3, and the three stripe-like structures 1044 are respectively arranged in the $N^{th}$ column of sub-light-emitting regions, the $(N-1)^{th}$ column of sub-light-emitting regions and the $(N-2)^{th}$ column of sub-light-emitting regions. By analogy, when the second portion 1042 of the second signal line 104 comprises (N−Y+1) stripe-like structures 1044, the (N−Y+1) stripe-like structures 1044 are respectively arranged in the $Y^{th}$ column to the $N^{th}$ column of sub-light-emitting regions. As shown in the figure, each strip-like structure 1044 is located at the leftmost in the corresponding column of sub-light-emitting regions, for example, the strip-like structure 1044 in the $Y^{th}$ column of sub-light-emitting regions is located at the leftmost in the $Y^{th}$ column of sub-light-emitting regions. It should be noted that the difference between Y and X may be greater than or equal to 1. When Y−X=1, the $Y^{th}$ column of sub-light-emitting regions is immediately behind the $X^{th}$ column of sub-light-emitting regions, that is, the $X^{th}$ column of sub-light-emitting regions is adjacent to the $Y^{th}$ column of sub-light-emitting regions. When Y−X>1, the $X_{th}$ column of sub-light-emitting regions and the $Y_{th}$ column of sub-light-emitting regions are separated by at least one column of sub-light-emitting regions, that is, the $X_{th}$ column of sub-light-emitting regions and the $Y_{th}$ column of sub-light-emitting regions are not adjacent.

As illustrated in FIG. 2, the light-emitting substrate 100 further comprises a first conductive portion 108 located on the same layer as the first signal line 103. In this application, the term "A is located on the same layer as B" means that A and B are located on the surface of the same layer and both are in direct contact with the surface. In some embodiments, A and B are formed from the same layer by using the same process. In some embodiments, A and B are located on and in direct contact with the surface of the same layer, and A and B have substantially the same height or thickness. The first conductive portion 108 comprises N−1 driving voltage signal lines VLEDL extending along the first direction D1, and each column of the second to $N^{th}$ columns of sub-light-emitting regions comprises one driving voltage signal line VLEDL. Each sub-light-emitting region 105 comprises at least one light-emitting unit 106. In each of the $2^{nd}$ to $N^{th}$ columns of sub-light-emitting regions, each driving voltage signal line VLEDL is connected to a first end of each light-emitting unit 106 in the column of sub-light-emitting regions, so as to provide the driving voltage for the light-emitting unit 106 during the required period. Also, the first portion 1031 of the first signal line 103 is connected to the first end of each light-emitting unit 106 in the first column of sub-light-emitting regions. The width of the first portion 1031 of the first signal line 103 along the second direction D2 is smaller than the width of each driving voltage signal line VLEDL along the second direction D2. In fact, it can be understood that, during the preparation process, the first signal line 103 and the plurality of driving voltage signal lines VLEDL are formed simultaneously by patterning a conductive layer, and the first portion 1031 of the first signal line 103 is equivalent to the driving voltage signal line VLEDL corresponding to the first column of sub-light-emitting regions, so as to provide the driving voltage for the light-emitting units 106 in the first column of sub-light-emitting regions during the required period.

The width of the first portion 1031 of the first signal line 103 along the second direction D2 is smaller than the width of each driving voltage signal line VLEDL along the second direction D2. That is, the width of the driving voltage signal line VLEDL (i.e., the first portion 1031 of the first signal line 103) located in the left frame area of the light-emitting substrate 100, that is, the first area 1021, which is the distance from the center of the light-emitting unit 106 in the first column of sub-light-emitting regions to the first side 001 of the light-emitting substrate 100, is smaller than the width of the driving voltage signal line VLEDL located in the light-emitting region 101, therefore, it is beneficial to reduce the width of the left frame of the light-emitting substrate 100, and is beneficial to realize a narrow frame. In order to meet the resistance and the voltage drop requirements, the width of the driving voltage signal line VLEDL along the second direction D2 is generally 2~15 mm, for example, 4.0 mm in an example. However, the width of the left frame area of the light-emitting substrate 100 along the second direction D2 is required to be within 3.8 mm. If the driving voltage signal line VLEDL with a width of 4.0 mm is arranged in the left frame area, the narrow frame requirement of the product cannot be satisfied. In the present application, by making the width of the first portion 1031 of the first signal line 103 along the second direction D2 smaller than the width of the driving voltage signal line VLEDL along the second direction D2, for example, the width of the first portion 1031 of the first signal line 103 along the second direction D2 can be realized to be 0.05-0.5 mm, which can greatly reduce the width of the left frame area of the light-emitting substrate 100, and can fully meet the narrow frame requirements of the product. If such a light-emitting substrate 100 needs to be spliced to form a large-sized light-emitting substrate, the light-emitting substrate 100 with an extremely narrow frame can also fully meet the splicing requirement without affecting the optical and mechanical matching. Moreover, due to the existence of the second portion 1032 of the first signal line 103, it is equivalent to extending a portion of the width of the first signal line 103 into the light-emitting region 101. Therefore, even if the width of the first portion 1031 of the first signal line 103 is reduced to 0.05-0.5 mm, the requirements on the resistance and voltage drop of the first signal line 103 can be met without affecting the luminous efficiency and luminous uniformity of the light-emitting substrate 100.

Continuing to refer to FIG. 2, the first conductive portion 108 may further comprise (N−1) common voltage signal lines GNDL extending along the first direction D1, and the first conductive portion 108 and the second signal line 104 are located on the same layer, that is, the first signal line 103, the second signal line 104 and the first conductive portion 108 are located on the same layer. Each column of the first to $(N-1)^{th}$ columns of sub-light-emitting regions comprises one common voltage signal line GNDL, and each sub-light-emitting region 105 further comprises a driving circuit 107 connected to a second end of at least one light-emitting unit 106. In each column of the first to $(N-1)^{th}$ columns of sub-light-emitting regions, each common voltage signal line GNDL is connected to each driving circuit 107 in the column of sub-light-emitting regions, so as to provide a common voltage (e.g., a ground voltage) during a required period of time. The first portion 1041 of the second signal line 104 is connected to each driving circuit 107 in the $N^{th}$ column of sub-light-emitting regions. The width of the first portion 1041 of the second signal line 104 along the second direction D2 is smaller than the width of each common voltage signal line GNDL along the second direction D2. In fact, it can be understood that, during the preparation process, the first signal line 103, the second signal line 104, the driving voltage signal line VLEDL and the common voltage signal line GNDL are simultaneously formed by patterning the conductive layer. The first portion 1041 of the second signal line 104 is equivalent to the common voltage signal line GNDL corresponding to the $N^{th}$ column of sub-light-emitting regions, so as to provide the common voltage in a required period of time.

The width of the first portion 1041 of the second signal line 104 along the second direction D2 is smaller than the width of each common voltage signal line GNDL along the second direction D2. that is, the width of the common voltage signal line GNDL (i.e., the first portion 1041 of the second signal line 104) located in the right frame area of the light-emitting substrate 100, that is, the second area 1022, which is the distance from the center of the light-emitting unit 106 in the $N^{th}$ column of sub-light-emitting regions to the second side 002 of the light-emitting substrate 100, is smaller than the width of the common voltage signal line GNDL located in the light-emitting region 101, so as to reduce the width of the right frame of the light-emitting substrate 100 and realize a narrow frame. In order to meet the resistance and the voltage drop requirements, the width of the common voltage signal line GNDL along the second direction D2 is generally 2~15 mm, for example, 4.0 mm in an example. However, the width of the right frame area of the light-emitting substrate 100 along the second direction D2 is required to be within 3.8 mm. If the common voltage signal line GNDL with a width of 4.0 mm and some other necessary signal lines are arranged in the right frame area, it cannot meet the narrow frame requirement of the product. In the present application, by making the width of the first portion 1041 of the second signal line 104 along the second direction D2 smaller than the width of the common voltage signal line GNDL along the second direction D2, for example, the width of the first portion 1041 of the second signal line 104 along the second direction D2 can be realized to be 0.05-0.5 mm, which can greatly reduce the width of the right frame area of the light-emitting substrate 100, and can fully meet the narrow frame requirement of the product. If such a light-emitting substrate 100 needs to be spliced to form a large-sized light-emitting substrate, the light-emitting substrate 100 with an extremely narrow frame can also fully meet the splicing requirement without affecting the optical and mechanical matching. Moreover, due to the existence of the second portion 1042 of the second signal line 104, it is equivalent to extending a portion of the width of the second signal line 104 into the light-emitting region 101. Therefore, even if the width of the first portion 1041 of the second signal line 104 is reduced to be 0.05-0.5 mm, the requirements on the resistance and voltage drop of the second signal line 104 can also be met, and the luminous efficiency and luminous uniformity of the light-emitting substrate 100 will not be affected.

By making the first portion 1031 of the first signal line 103 and the first portion 1041 of the second signal line 104 have very narrow widths, the light-emitting substrate 100 can have very narrow left and right frames. The very narrow left and right frames can even be ignored so that the light-emitting substrate 100 can be realized as a frameless product.

As shown in FIG. 2, in each column of the 2nd to (N−1)th columns of sub-light-emitting regions, the driving voltage signal line VLEDL, the light-emitting unit 106, the driving circuit 107, and the common voltage signal line GNDL are sequentially arranged along the second direction D2, and their orthographic projections on the light-emitting substrate 100 do not overlap with each other. The first conductive portion 108 may further comprise N feedback signal lines FBL extending along the first direction D1, and each column of sub-light-emitting regions comprises one feedback signal line FBL. In each column of sub-light-emitting regions, the driving circuits 107 are cascaded in sequence, and each feedback signal line FBL is connected to the last-cascaded driving circuit 107. In at least some columns of the N columns of sub-light-emitting regions, each feedback signal line FBL is located on a side of the common voltage signal line GNDL located in the same column of sub-light-emitting regions as the feedback signal line FBL away from the driving circuit 107. In an example, in each column of the $1^{st}$ to $(N-1)^{th}$ columns of sub-light-emitting regions, each feedback signal line FBL bypasses the common voltage signal line GNDL and is located on the side of the common voltage signal line GNDL away from the driving circuit 107. In the $N^{th}$ column of sub-light-emitting regions, the feedback signal line FBL bypasses the adjacent signal line (e.g., the power signal line PwL) on the right side thereof and is located on the side of the adjacent signal line away from the driving circuit 107. That is to say, in the $1^{st}$ to $N^{th}$ columns of sub-light-emitting regions, all the feedback signal lines FBL are wired in the same way, which can simplify the wiring process and improve the production efficiency. In another example, as illustrated in FIG. 2, in each column of the $1^{st}$ to $X^{th}$ columns of sub-light-emitting regions, that is, in each column where the strip-like structure 1034 of the second portion 1032 of the first signal line 103 is arranged, each feedback signal line FBL bypasses the common voltage signal line GNDL and is located on the side of the common voltage signal line GNDL away from the driving circuit 107; in each column of the Yth to Nth columns of sub-light-emitting regions, that is, in each column where the strip-like structure 1044 of the second portion 1042 of the second signal line 104 is arranged, the feedback signal line FBL bypasses the driving voltage signal line VLEDL and is located on the side of the driving voltage signal line VLEDL away from the driving circuit 107. With this arrangement, the feedback signal line FBL in the Nth column of sub-light-emitting regions can be prevented from overlapping with the first portion 1041 of the second signal line 104.

Figure 3:
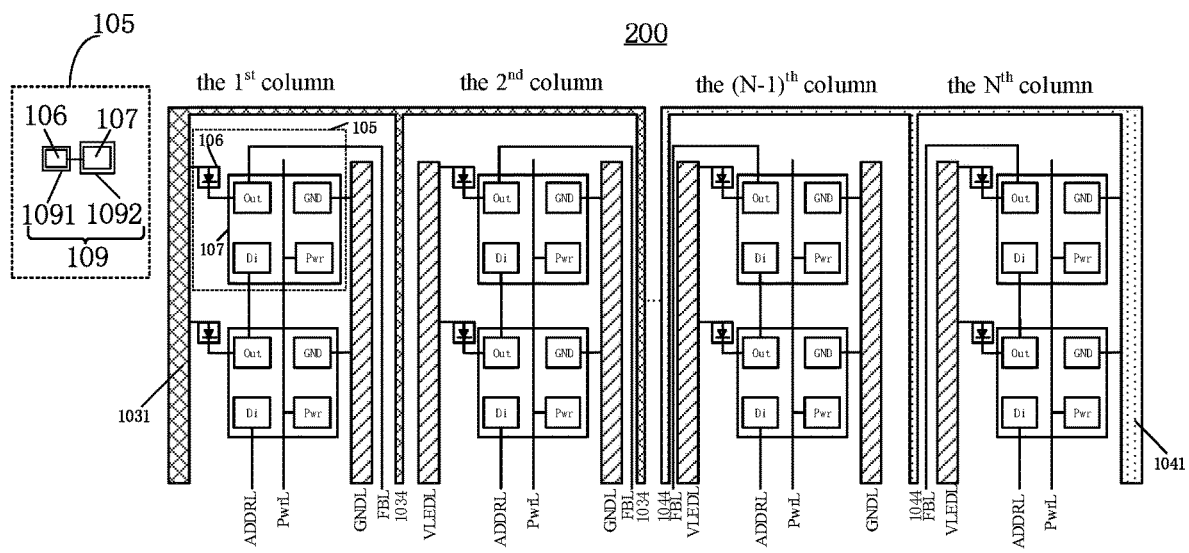
FIG. 3 illustrates a schematic diagram of the arrangement of a light-emitting substrate provided according to an embodiment of the present disclosure.
Figure 4:
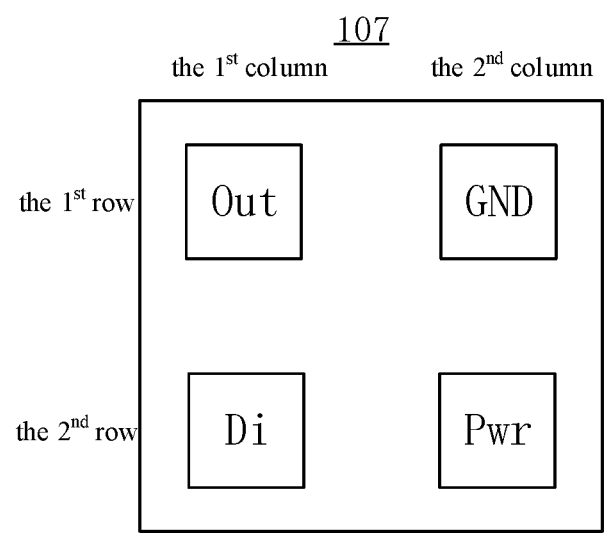
FIG. 4 illustrates a schematic diagram of the arrangement of terminals of the driving circuit of the light-emitting substrate in FIG. 3.

FIG. 3 illustrates the arrangement of a light-emitting substrate 200, and FIG. 4 illustrates the arrangement of terminals of the driving circuit 107 of the light-emitting substrate 200. For the sake of clarity, FIG. 3 only illustrates four columns of sub-light-emitting regions, i.e., the first column of sub-light-emitting regions, the second column of sub-light-emitting regions, the $(N-1)^{th}$ column of sub-light-emitting regions, and the $N^{th}$ column of sub-light-emitting regions. The light-emitting substrate 200 illustrated in FIG. 3 has substantially the same configuration as the light-emitting substrate 100 illustrated in FIG. 2, and thus the same reference numerals are used to refer to the same components. Therefore, for the detailed functions of the components in FIG. 3 with the same reference numerals as those in FIG. 2, reference may be made to the description of FIG. 2, which will not be repeated here.

The dotted box on the left side of FIG. 3 illustrates an enlarged view of one sub-light-emitting region 105. As illustrated in the enlarged view, the light-emitting substrate 200 further comprises a second conductive portion 109, and the second conductive portion 109 comprises a plurality of first pads 1091 and a plurality of second pads 1092. The light-emitting unit 106 is mounted on the first pad 1091, and the driving circuit 107 is mounted on the second pad 1092. In the example of FIG. 3, the first conductive portion 108 and the second conductive portion 109 are located on the same layer. During the preparation process, the same conductive layer can be patterned to simultaneously form the first conductive portion 108 and the second conductive portion 109.

As illustrated in FIGS. 3 and 4, each driving circuit 107 comprises four terminals, which are an address terminal Di, a power terminal Pwr, a common voltage terminal GND, and an output terminal Out, respectively. The output terminal Out and the address terminal Di are the first column of terminals of the driving circuit 107, which are located on a side of the driving circuit 107 adjacent to the driving voltage signal line VLEDL (the first column of terminals of the driving circuit 107 in the first column of sub-light-emitting regions is located on the side of the driving circuit 107 adjacent to the first portion 1031 of the first signal line 103); the common voltage terminal GND and the power terminal Pwr are the second column of terminals of the driving circuit 107, which are located on a side of the driving circuit 107 adjacent to the common voltage signal line GNDL (the second column of terminals of the driving circuit 107 in the $N^{th}$ column of sub-light-emitting regions is located on the side of the driving circuit 107 adjacent to the first portion 1041 of the second signal line 104). The common voltage terminal GND and the output terminal Out are located in the first row of the plurality of terminals, and the address terminal Di and the power terminal Pwr are located in the second row of the plurality of terminals. The first conductive portion 108 further comprises N address selection signal lines ADDRL extending along the first direction D1, so that each column of sub-light-emitting regions comprises one address selection signal line ADDRL. In each column of sub-light-emitting regions, the address selection signal line ADDRL is connected to the address terminal Di of the first-cascaded driving circuit 107. The output terminal Out can be multiplexed as a relay terminal of the driving circuit 107. The address selection signal line ADDRL is configured to transmit an address signal to the address terminal Di of the first-cascaded driving circuit 107 in each column of sub-light-emitting regions. After receiving the address signal, the first-cascaded driving circuit 107 can parse, obtain and store the address information in the address signal to use as the address information of the first-cascaded driving circuit 107. At the same time, the address information can be incremented by 1 or by another fixed value, and the incremented address information (new address information) can be modulated into a relay signal. The relay terminal Out of the first-cascaded driving circuit 107 transmits the relay signal to the address terminal Di of the second-cascaded driving circuit 107 via the cascade wiring, as the address information of the second-cascaded driving circuit 107. By analogy, corresponding address information can finally be configured for each driving circuit 107 in each column of sub-light-emitting regions. The output terminal Out of the last-cascaded driving circuit 107 is connected to the feedback signal line FBL. One end of the output terminal Out is connected to the cascade wiring (the output terminal Out of the last-cascaded driving circuit 107 is connected to the feedback signal line FBL), and the other end of the output terminal Out is connected to the second end of a light-emitting unit 106 connected with the driving circuit 107. The output terminal Out can output different signals in different time periods. For example, the output terminal Out of the driving circuit 107 outputs a relay signal in a period as the address signal of the next-cascaded driving circuit 107 cascaded with the driving circuit 107, and provide a driving signal to the light-emitting unit 106 connected with the driving circuit 107 in another period to make the light-emitting unit 106 emit light.

The first conductive portion 108 further comprises N power signal lines PwrL extending along the first direction D1, and each column of sub-light-emitting regions comprises one power signal line PwrL. In each column of sub-light-emitting regions, one power signal line PwrL is connected to the power terminals Pwr of all the driving circuits 107 in the column of sub-light-emitting regions, and the orthographic projection of the first column of terminals of each driving circuit 107 on the light-emitting substrate 200 and the orthographic projection of the second column of terminals of each driving circuit 107 on the light-emitting substrate 200 are respectively located on both sides of the orthographic projection of the power signal line PwrL on the light-emitting substrate 200. That is, the power signal line PwrL is arranged within the area occupied by each driving circuit 107 and does not overlap with the first and second columns of terminals of each driving circuit 107. By arranging the power signal line PwrL in each column of sub-light-emitting regions in the area occupied by the driving circuits 107, wiring space can be saved, and overlapping between the power signal line PwrL and other signal lines can be avoided.

In the example of FIG. 3, the first signal line 103, the driving voltage signal line VLEDL, the address selection signal line ADDRL, the power signal line PwrL, the common voltage signal line GNDL, the feedback signal line FBL, and the second signal line 104 are located on the same layer, and their orthographic projections on the light-emitting substrate 200 do not overlap with each other. In an example, the distance between any two adjacent signal lines among these signal lines is greater than or equal to 200 μm, so that the phenomenon of signal interference between the signal lines can be avoided.

Figure 5:
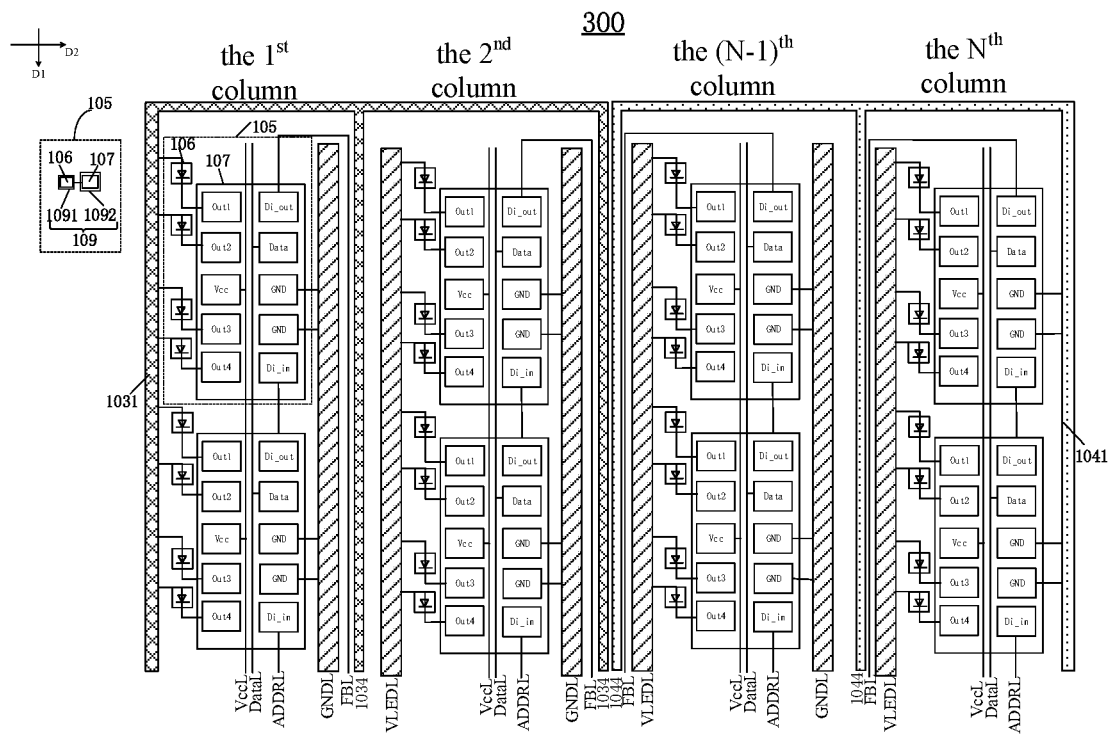
FIG. 5 illustrates a schematic diagram of the arrangement of a light-emitting substrate provided according to an embodiment of the present disclosure.
Figure 6:
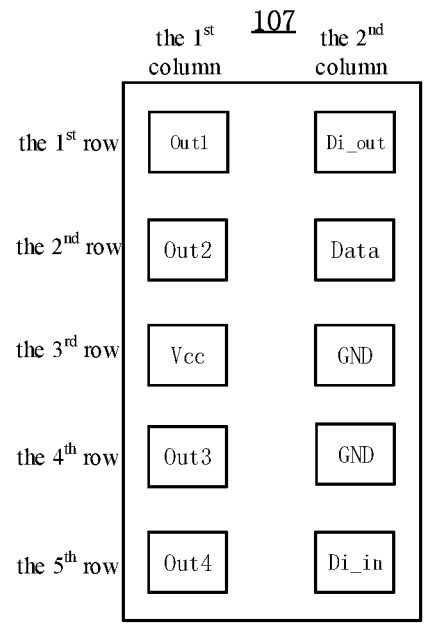
FIG. 6 illustrates a schematic diagram of the arrangement of terminals of the driving circuit of the light-emitting substrate in FIG. 5.

FIG. 5 illustrates the arrangement of a light-emitting substrate 300, and FIG. 6 illustrates the arrangement of terminals of the driving circuit 107 of the light-emitting substrate 300. For the sake of clarity, FIG. 5 only illustrates four columns of sub-light-emitting regions, i.e., the first column of sub-light-emitting regions, the second column of sub-light-emitting regions, the $(N-1)^{th}$ column of sub-light-emitting regions, and the $N^{th}$ column of sub-light-emitting regions. The light-emitting substrate 300 illustrated in FIG. 5 has substantially the same configuration as the light-emitting substrate 200 illustrated in FIG. 3, and thus the same reference numerals are used to refer to the same components. Therefore, for the detailed functions of the components in FIG. 5 with the same reference numerals as those in FIG. 3, reference may be made to the description of FIG. 3, which will not be repeated here. For the sake of brevity, only the differences between the light-emitting substrate 300 in FIG. 5 and the light-emitting substrate 200 in FIG. 3 are described below.

Referring to FIG. 5 and FIG. 6, the difference from the light-emitting substrate 200 in FIG. 3 is that the number of terminals of the driving circuit 107 of the light-emitting substrate 300 in FIG. 5 is multiple, wherein the number of the output terminals Out is multiple, and the number of the common voltage terminals GND is at least one. FIG. 6 illustrates that the number of the output terminals Out is four and the number of the common voltage terminals GND is two, but this is just an example. The number of the output terminals Out may be more or less than four, and the number of the common voltage terminals GND may be more or less than two. In the embodiment of the present disclosure, the number of the output terminals Out is at least two, and the number of the common voltage terminals GND is at least one. In addition, the driving circuit 107 also comprises a data terminal Data. As illustrated in FIG. 5 and FIG. 6, the driving circuit 107 comprises two columns of terminals, the first column of terminals comprises a power terminal Vcc and four output terminals Out1, Out2, Out3, and Out4, the first column of terminals is located on the side of the driving circuit 107 adjacent to the driving voltage signal line VLEDL (the first column of terminals of the driving circuit 107 in the first column of sub-light-emitting regions is located on the side of the driving circuit 107 adjacent to the first portion 1031 of the first signal line 103); the second column of terminals comprises the address terminal Di_in, the relay terminal Di_out, the data terminal Data, and two common voltage terminals GND, the second column of terminals is located on the side of the driving circuit 107 adjacent to the common voltage signal line GNDL (the second column of terminals of the driving circuit 107 in the $Nt^h$ column of sub-light-emitting regions is located on the side of the driving circuit 107 adjacent to the first portion 1041 of the second signal line 104). The plurality of terminals of the driving circuit 107 are arranged in five rows, the address terminal Di_in is located in the $5^{th}$ row of the plurality of terminals, and the relay terminal Di_out is located in the $1^{st}$ row of the plurality of terminals. Although FIG. 6 illustrates that the power terminal Vcc is located in the third row of the first column of terminals, and the data terminal Data is located in the second row of the second column of terminals, this is only an example, and the embodiments of the present disclosure do not limit the specific position of the power terminal Vcc in the first column of terminals and the specific position of the data terminal Data in the second column of terminals. For example, the power terminal Vcc may be located in any one of the $1^{st}$ row to the $5^{th}$ row of the first column of terminals, and the data terminal Data may be located in any one of the $2^{nd}$ row to the $4^{th}$ row of the second column of terminals.

As illustrated in the figure, the four output terminals Out1, Out2, Out3 and Out4 of the driving circuit 107 are connected to the second ends of the four light-emitting units 106 in a one-to-one correspondence to provide driving signals for the light-emitting units 106. In the example of FIG. 5, the output terminal and the relay terminal of the driving circuit 107 are different terminals. The driving circuit 107 is configured to output a relay signal through the relay terminal Di_out as an address signal for the next-cascaded driving circuit 107 cascaded with the driving circuit 107 during a period, and provide driving signals to the four light-emitting units 106 respectively through the four output terminals Out1, Out2, Out3, and Out4 during another period.

As described above, except for the first signal line 103, the driving voltage signal line VLEDL, the address selection signal line ADDRL, the common voltage signal line GNDL, the feedback signal line FBL, and the second signal line 104, the first conductive portion 108 of the light-emitting substrate 300 further comprises N power signal lines VccL and N data driving signal lines DataL extending along the first direction D1, so that each column of sub-light emitting regions comprises one power signal line VccL and one data driving signal line DataL. In each column of sub-light-emitting regions, one power signal line VccL is connected to the power terminals Vcc of all the driving circuits 107 in the column of sub-light-emitting regions, and one data driving signal line DataL is connected to the data terminals Data of all the driving circuits 107 in the column of sub-light-emitting regions. In each column of sub-light-emitting regions, the orthographic projection of the first column of terminals of each driving circuit 107 on the light-emitting substrate 300 and the orthographic projection of the second column of terminals of each driving circuit 107 on the light-emitting substrate 300 are respectively located on both sides of the orthographic projection of the power signal line VccL and the data driving signal line DataL on the light-emitting substrate 300, that is, the power signal line VccL and the data driving signal line DataL are arranged in the area occupied by each driving circuit 107, and without overlapping the first column of terminals and the second column of terminals of each driving circuit 107. Moreover, in each column of sub-light-emitting regions, the orthographic projection of the data driving signal line DataL on the light-emitting substrate 300 does not overlap with the orthographic projection of the power signal line VccL on the light-emitting substrate 300. By arranging the data driving signal line DataL and the power signal line VccL in each column of sub-light-emitting regions in the area occupied by the driving circuit 107, the wiring space can be saved, and the overlap between the data driving signal line DataL and the power signal line VccL and other signal lines can be avoided.

The first conductive portion 108 and the second conductive portion 109 of the light-emitting substrate 300 are located on the same layer. That is, the first signal line 103, the driving voltage signal line VLEDL, the address selection signal line ADDRL, the power signal line VccL, the data driving signal line DataL, the common voltage signal line GNDL, the feedback signal line FBL, and the second signal line 104 are all located on the same layer, and their orthographic projections on the light-emitting substrate 300 do not overlap with each other.

Figure 7A:
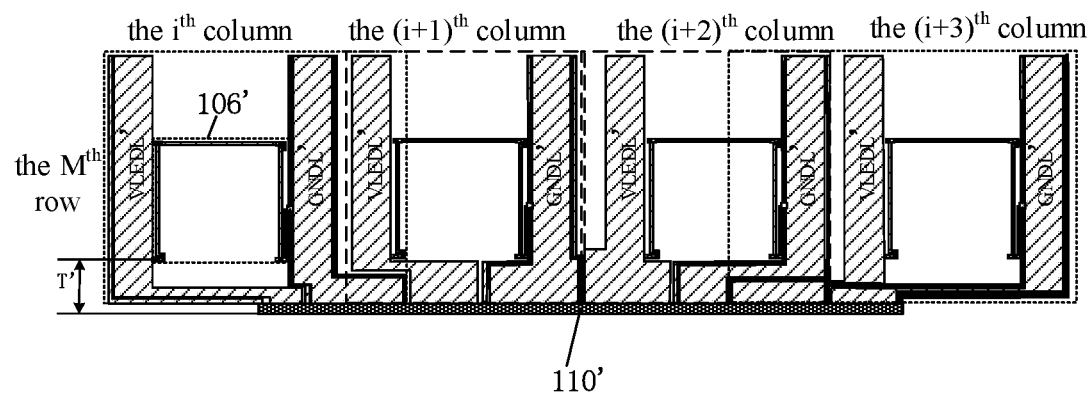
FIG. 7A illustrates a connection between the signal lines and the bonding electrode of the light-emitting substrate in the related art.

In addition to the need to design the left and right frames of the light-emitting substrate as narrow frames, there is also an urgent need to narrow the width of the lower frame of the light-emitting substrate. In the related art, as illustrated in FIG. 7A, the light-emitting substrate comprises a bonding electrode 110'. FIG. 7A illustrates four columns of sub-light-emitting regions, namely, the $i^{th}$ column of sub-light-emitting regions, the $(i+1)^{th}$ column of sub-light-emitting regions, the $(i+2)^{th}$ column of sub-light-emitting regions, and the $(i+3)^{th}$ column of sub-light-emitting regions, and the area occupied by each column of sub-light-emitting regions is respectively shown with dotted boxes. Each column of sub-light-emitting regions comprises a light-emitting unit 106', a common voltage signal line GNDL' and a driving voltage signal line VLEDL', and both the common voltage signal line GNDL' and the driving voltage signal line VLEDL' are electrically connected to the bonding electrode 110'. As illustrated in the figure, a portion of the common voltage signal line GNDL' of the $i^{th}$ column of sub-light-emitting regions extends into the adjacent $(i+1)^{th}$ column of sub-light-emitting regions and is electrically connected to the bonding electrode 110' in the $(i+1)^{th}$ column of sub-light-emitting regions, a portion of the driving voltage signal line VLEDL' of the $(i+3)^{th}$ column of sub-light-emitting regions extends into the adjacent $(i+2)^{th}$ column of sub-light-emitting regions and is electrically connected to the bonding electrode 110' in the $(i+2)^{th}$ column of sub-light-emitting regions. Since the common voltage signal line GNDL' of the $i^{th}$ column of sub-light-emitting regions and the driving voltage signal line VLEDL' of the $(i+3)^{th}$ column of sub-light-emitting regions occupy the portion of the bonding electrode 110' located in the $(i+1)^{th}$ column of sub-light-emitting regions and the portion of the bonding electrode 110' located in the $(i+2)^{th}$ column of sub-light-emitting region, respectively, in order to achieve electrical connection with the bonding electrode 110', the common voltage signal line GNDL' and the driving voltage signal line VLEDL' in the $(i+1)^{th}$ column of sub-light-emitting regions, and the common voltage signal line GNDL' and the driving voltage signal line VLEDL' in the $(i+2)^{th}$ column of sub-light-emitting regions need to further extend toward the direction of the bonding electrode 110' compared to the signal lines in the $i^{th}$ column of sub-light-emitting regions and in the $(i+3)^{th}$ column of sub-light-emitting regions, that is, extend toward the bottom of the light-emitting substrate, so as to electrically connect to the bonding electrode 110'. In this way, the width T' of the lower frame (that is, the area from the center of the light-emitting units 106' in the last row (the $M^{th}$ row) of sub-light-emitting regions to the bonding electrode 110') of the light-emitting substrate is significantly increased, so that the light-emitting substrate has a very wide lower frame, which cannot meet the design requirements of a narrow frame.

Figure 7B:
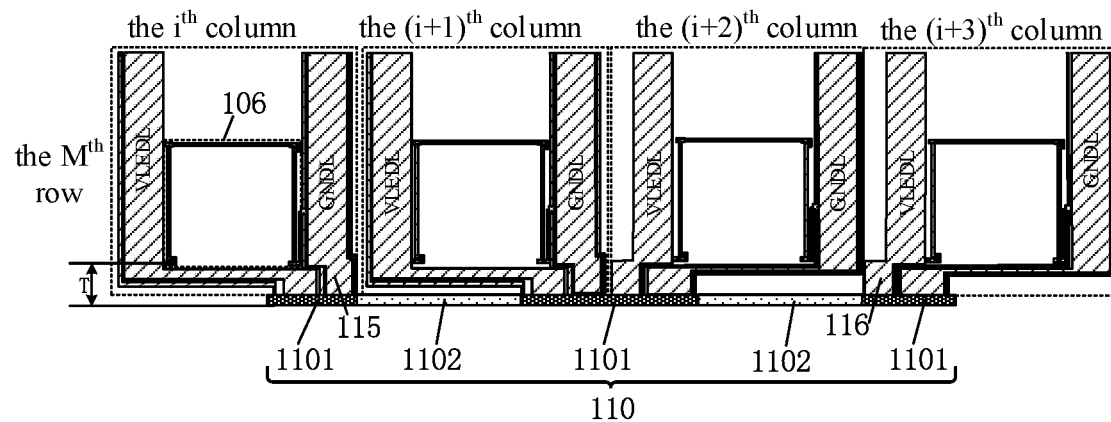
FIG. 7B illustrates a connection between the signal lines and the bonding electrode of a light-emitting substrate provided according to an embodiment of the present disclosure.

In view of this, the embodiments of the present disclosure provide a solution to reduce the width of the lower frame of the light-emitting substrate, and the solution can be applied to the light-emitting substrates described in any of the previous embodiments, such as the light-emitting substrates 100, 200 and 300. As illustrated in FIG. 7B, the light-emitting substrate may further comprise a bonding electrode 110 located in the peripheral region 102, the bonding electrode 110 comprises a valid terminal 1101 and a dummy terminal 1102. The first portion 1031 and the second portion 1032 of the first signal line 103, the first portion 1041 and the second portion 1042 of the second signal line 104, and all signal lines of the first conductive portion 108 are only electrically connected to the valid terminals 1101 of the bonding electrode 110. The first portion 1031 and the plurality of strip-like structures 1034 of the second portion 1032 of the first signal line 103 are connected to the valid terminals 1101 of the bonding electrode 110, and the valid terminals 1101 of the bonding electrode 110 provide the same signal to the first portion 1031 and the plurality of strip-like structures 1034 of the second portion 1032 of the first signal line 103. The first portion 1041 and the plurality of strip-like structures 1044 of the second portion 1042 of the second signal line 104 are connected to the valid terminals 1101 of the bonding electrode 110, and the valid terminals 1101 of the bonding electrode 110 provide the same signal to the first portion 1041 and the plurality of strip-like structures 1044 of the second portion 1042 of the second signal line 104. The signal received by the first signal line 103 is different from the signal received by the second signal line 104. The driving voltage signal line VLEDL, the address selection signal line ADDRL, the power signal line VccL, the common voltage signal line GNDL, the feedback signal line FBL and optionally the data driving signal line DataL of the first conductive portion 108 are all connected to the valid terminals 1101 of the bonding electrode 110.

For the sake of clarity, FIG. 7B only illustrates the last row of sub-light-emitting regions, namely the $M^{th}$ row of sub-light-emitting regions, which illustrates four columns of sub-light-emitting regions, i.e. the $i^{th}$ column of sub-light-emitting regions, the $(i+1)^{th}$ column of sub-light-emitting regions, the $(i+2)^{th}$ column of sub-light-emitting regions, and the $(i+3)^{th}$ column of sub-light-emitting regions, and the area occupied by each column of sub-light-emitting regions is respectively shown with dashed boxes. The four columns of sub-light-emitting regions may be any adjacent four columns of sub-light-emitting regions in the N columns of sub-light-emitting regions. It should be noted that although FIG. 7B illustrates that the bonding electrode 110 is connected to the signal lines in the adjacent four columns of sub-light-emitting regions, this is only an example. In an alternative example, the bonding electrode 110 may be connected to the signal lines in more than four columns of sub-light-emitting regions or less than four columns of sub-light-emitting regions, and the embodiments of the present disclosure do not specifically limit the number of columns of sub-light-emitting regions connected to the bonding electrode 110. For the sake of clarity, only the light-emitting unit 106, the common voltage signal line GNDL and the driving voltage signal line VLEDL are illustrated in each column of sub-light-emitting regions, and other signal lines are omitted. The common voltage signal line GNDL comprises a first connection portion 115, the driving voltage signal line VLEDL comprises a second connection portion 116, each common voltage signal line GNDL is electrically connected to the valid terminal 1101 of the bonding electrode 110 via its first connection portion 115, and each driving voltage signal line VLEDL is electrically connected to the valid terminal 1101 of the bonding electrode 110 via its second connection portion 116. In each column of the $1^{st}$ to $(N-1)^{th}$ columns of sub-light-emitting regions, the first connection portion 115 of the common voltage signal line GNDL is only located in the column of sub-light-emitting regions where the common voltage signal line GNDL is located without extending into the adjacent columns of sub-light-emitting regions; in each column of the $2^{nd}$ to $N^{th}$ columns of sub-light-emitting regions, the second connection portion 116 of the driving voltage signal line VLEDL is only located in the column of sub-light-emitting regions where the driving voltage signal line VLEDL is located without extending into the adjacent columns of sub-light-emitting regions. As illustrated in FIG. 7B, the first connection portion 115 of the common voltage signal line GNDL and the second connection portion 116 of the driving voltage signal line VLEDL in the ith column of sub-light-emitting regions are completely located in the $i^{th}$ column of sub-light-emitting regions without extending into the adjacent $(i+1)^{th}$ column of sub-light-emitting regions, and are electrically connected to the valid terminal 1101 of the bonding electrode 110 in the $i^{th}$ column of sub-light-emitting regions; the first connection portion 115 of the common voltage signal line GNDL and the second connection portion 116 of the driving voltage signal line VLEDL in the $(i+1)^{th}$ column of sub-light-emitting regions are completely located in the $(i+1)^{th}$ column of sub-light-emitting regions without extending into the adjacent $i^{th}$ column of sub-light-emitting regions and the adjacent $(i+2)^{th}$ column of sub-light-emitting regions, and are electrically connected to the valid terminal 1101 of the bonding electrode 110 in the $(i+1)^{th}$ column of sub-light-emitting regions; the first connection portion 115 of the common voltage signal line GNDL and the second connecting portion 116 of the driving voltage signal line VLEDL in the $(i+2)^{th}$ column of sub-light-emitting regions are completely located in the $(i+2)^{th}$ column of sub-light-emitting regions without extending into the adjacent $(i+1)^{th}$ column of sub-light-emitting regions and the adjacent $(i+3)^{th}$ column of sub-light-emitting regions, and are electrically connected to the valid terminal 1101 of the bonding electrode 110 in the $(i+2)^{th}$ column of sub-light-emitting regions; the first connection portion 115 of the common voltage signal line GNDL and the second connection portion 116 of the driving voltage signal line VLEDL in the $(i+3)^{th}$ column of sub-light-emitting regions are completely located in the $(i+3)^{th}$ column of sub-light-emitting regions without extending into the adjacent $(i+2)^{th}$ column of sub-light-emitting regions, and are electrically connected to the valid terminal 1101 of the bonding electrode 110 in the $(i+3)^{th}$ column of sub-light-emitting regions. Since the common voltage signal line GNDL in the $i^{th}$ column of sub-light-emitting regions and the driving voltage signal line VLEDL in the $(i+3)^{th}$ column of sub-light-emitting regions are respectively electrically connected to the valid terminals 1101 of the bonding electrode 110 in the column where they are located, there is no need for the common voltage signal line GNDL and the driving voltage signal line VLEDL in the $(i+1)^{th}$ column of sub-light-emitting regions and the common voltage signal line GNDL and the driving voltage signal line VLEDL in the $(i+2)^{th}$ column of sub-light-emitting regions to further extend toward the direction of the bonding electrode 110. In this way, the width T of the lower frame (that is, the area from the center of the light-emitting units 106 in the $M^{th}$ row of sub-light-emitting regions to the bonding electrode 110) of the light-emitting substrate is greatly reduced, so that the light-emitting substrate has a very narrow lower frame, which can meet the design requirements of narrow frame. In an example, the width T of the lower frame of the light-emitting substrate is 4.15 mm, which is 3.35 mm smaller than the width T' (which is 7.5 mm) of the lower frame in the related art.

It should be noted that, the technical solution illustrated in FIG. 7B can be combined with the designs of the first signal line 103 and/or the second signal line 104 described in any of the previous embodiments, so as to realize the left narrow frame and/or the right narrow frame and the lower narrow frame of the light-emitting substrate. It may not be combined with the designs of the first signal line 103 and the second signal line 104 described in any of the previous embodiments, that is, the design illustrated in FIG. 7B can be made only for the bonding electrode 110 of the light-emitting substrate, so as to realize the lower narrow frame of the light-emitting substrate alone.

Figure 8:
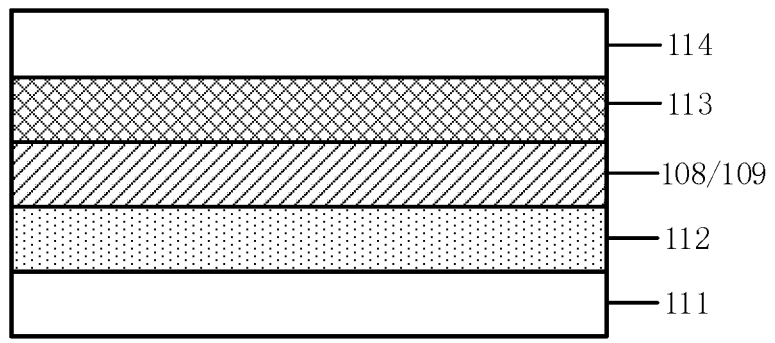
FIG. 8 illustrates a schematic structural diagram of a light-emitting substrate provided according to an embodiment of the present disclosure.

As illustrated in FIG. 8, the light-emitting substrate provided in the above embodiments may further comprise a base substrate 111, a buffer layer 112 and a first insulating layer 113. The buffer layer 112 is located between the layer where the first conductive portion 108 and the second conductive portion 109 are located and the base substrate 111, and the first insulating layer 113 is located on the side of the layer where the first conductive portion 108 and the second conductive portion 109 are located away from the base substrate 111. The base substrate 111 may be any suitable substrate such as a plastic substrate, a silicon substrate, a ceramic substrate, a glass substrate, a quartz substrate, etc. The embodiments of the present disclosure do not limit the material of the base substrate 111. The buffer layer 112 can be used to reduce the stress caused to the base substrate 111 when the first conductive portion 108 and the second conductive portion 109 are prepared, so as to avoid the bending deformation of the base substrate 111; the buffer layer 112 can also prevent impurities in the base substrate 111 from adversely affecting the conductive performance of the first conductive portion 108 and the second conductive portion 109. The buffer layer 112 may be any suitable material, for example, may be SiN. The first insulating layer 113 can be used to protect the first conductive portion 108 and the second conductive portion 109 from being oxidized and corroded by water, oxygen, etc. in the environment. The material of the first insulating layer 113 may be an organic material, an inorganic material, or a combination of an organic material and an inorganic material. The first insulating layer 113 may be a single layer, or may comprise a plurality of layers. Optionally, the light-emitting substrate may further comprise a second insulating layer 114, and the second insulating layer 114 is located on a side of the first insulating layer 113 away from the base substrate 111. The material of the second insulating layer 114 may be an organic material, an inorganic material, or a combination of an organic material and an inorganic material. The second insulating layer 114 may be a single layer, or may comprise multiple layers.

Materials of the first conductive portion 108 and the second conductive portion 109 located on the same layer may be any appropriate conductive material, which is not specifically limited in the embodiments of the present disclosure. For example, the material of the first conductive portion 108 and the second conductive portion 109 comprises copper. In an example, the first conductive portion 108 and the second conductive portion 109 may be a stack of Cu and CuNi. The side of the stack close to the base substrate 111 is a Cu layer, the thickness of which may be, for example, 2 um, and Cu is a preferred material as an electrical signal transmission channel. The side of the stack away from the base substrate 111 is a CuNi layer, and the thickness of which may be, for example, 0.6 um. The CuNi layer can be used to protect the Cu layer and prevent the surface of the Cu layer with low resistivity from being exposed and oxidized. In another example, the first conductive portion 108 and the second conductive portion 109 are, for example, a stack of MoNb/Cu/MoNb, and the side of the stack close to the base substrate 111 is a MoNb layer with a thickness of about 300 Å, which is mainly used to improve the adhesion between the stack and the base substrate 111; the intermediate layer of the stack is a Cu layer, and Cu is the preferred material for the electrical signal transmission channel; the side of the stack away from the base substrate 111 is a MoNb layer with a thickness of about 200Å. The MoNb layer can be used to protect the intermediate Cu layer and prevent the surface of the intermediate Cu layer with low resistivity from being exposed and oxidized.

Figure 9:
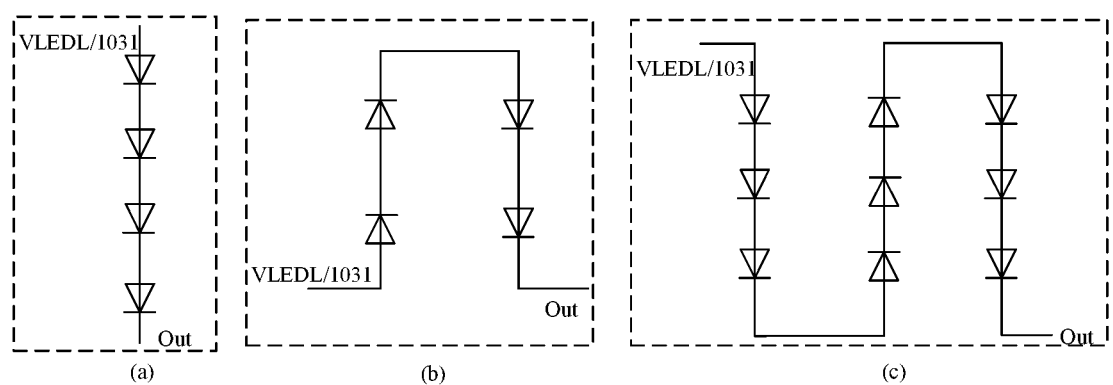
FIG. 9 illustrates a schematic diagram of the arrangement of a light-emitting unit of a light-emitting substrate provided according to an embodiment of the present disclosure.

FIG. 9 illustrates several alternative arrangements of each light-emitting unit 106 as an example. Each light-emitting unit 106 comprises a plurality of light-emitting elements connected to each other, and the first end of the plurality of light-emitting elements is electrically connected to the driving voltage signal line VLEDL (the first end of the plurality of light-emitting elements of the light-emitting unit 106 in the first column of sub-light-emitting regions is electrically connected to the first portion 1031 of the first signal line 103), and the second end of the plurality of light-emitting elements is electrically connected to the output terminal Out of the driving circuit 107. FIG. 9(a) illustrates that each light-emitting unit 106 comprises four light-emitting elements connected in series with each other, and the four light-emitting elements are arranged in 1 column*4 rows; FIG. 9(b) illustrates that each light-emitting unit 106 comprises four light-emitting elements connected in series with each other, and the four light-emitting elements are arranged in 2 columns*2 rows; FIG. 9(c) illustrates that each light-emitting unit 106 comprises nine light-emitting elements connected in series with each other, and the nine light-emitting elements are arranged in 3 columns*3 rows. Of course, the plurality of light-emitting elements of each light-emitting unit 106 are not limited to the above arrangement, and they may be arranged in any suitable manner. In an example, the plurality of light-emitting elements of each light-emitting unit 106 may be connected in parallel with each other. In another example, the plurality of light-emitting elements of each light-emitting unit 106 may be combined in series and in parallel. The number of light-emitting elements comprised in each light-emitting unit 106 may be determined according to actual requirements, for example, according to the size and the required brightness of the light-emitting substrate. Each light-emitting element may be an organic light emitting-diode or an inorganic light-emitting diode. In some embodiments, each light-emitting element may be a sub-millimeter light-emitting diode (Mini LED) or a micro light-emitting diode (Mirco LED). The size of the sub-millimeter light-emitting diode is, for example, in the range of 100 micrometers to 500 micrometers; the size of the micro light-emitting diode is, for example, less than 100 micrometers. The embodiments of the present disclosure do not limit the type and size of light-emitting elements of the light-emitting unit 106. By using sub-millimeter light-emitting diodes or micro light-emitting diodes as light-emitting elements of the light-emitting unit 106, a high dynamic range (HDR) display can be realized. When such a light-emitting substrate is used in a display device, the contrast of the display device can be significantly improved.

The above describes how the light-emitting substrate 100, the light-emitting substrate 200 and the light-emitting substrate 300 realize the left narrow frame, the right narrow frame, and the lower narrow frame. In the light-emitting substrate 200 and the light-emitting substrate 300, the first conductive portion 108 and the second conductive portion 109 are located on the same layer. The following describes how the light-emitting substrate realizes a narrow frame when the first conductive portion 108 and the second conductive portion 109 are located in different layers.

Figure 10:
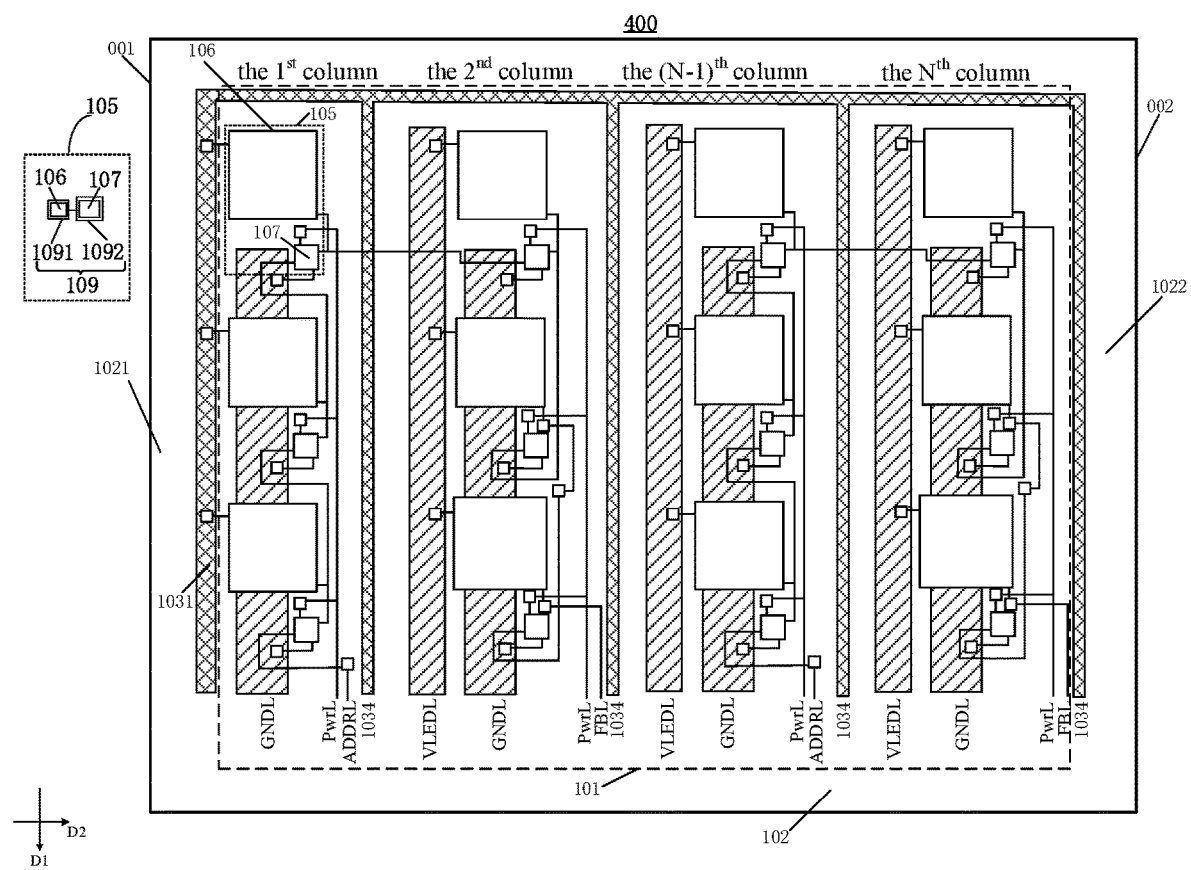
FIG. 10 illustrates a schematic diagram of the arrangement of a light-emitting substrate provided according to an embodiment of the present disclosure.

FIG. 10 illustrates a light-emitting substrate 400. The detailed functions of the components in FIG. 10 with the same reference numerals as those in FIG. 3 can be referred to the description of FIG. 3, which will not be repeated here. For the sake of brevity, only the differences between the light-emitting substrate 400 in FIG. 10 and the light-emitting substrate 200 in FIG. 3 are described below.

FIG. 10 illustrates N columns of sub-light-emitting regions, and the first conductive portion 108 and the second conductive portion 109 are located in different layers. The first conductive portion 108 comprises a driving voltage signal line VLEDL, an address selection signal line ADDRL, a power signal line PwrL, a common voltage signal line GNDL, and a feedback signal line FBL, and the light-emitting unit 106 and the driving circuit 107 are connected to the bonding electrodes of the bonding area via these signal lines, so as to receive corresponding electrical signals. The second conductive portion 109 comprises a first pad 1091 and a second pad 1092. The first pad 1091 is used for mounting the light-emitting unit 106, and the second pad 1092 is used for mounting the driving circuit 107. The first conductive portion 108 is located between the base substrate of the light-emitting substrate 400 and the second conductive portion 109, and the second conductive portion 109 is located on the side of the first conductive portion 108 away from the base substrate. A buffer layer is usually disposed between the base substrate and the first conductive portion 108, which can be used to reduce the stress to the base substrate during the preparation of the first conductive portion 108, so as to avoid the bending deformation of the base substrate. A first insulating layer is usually disposed between the first conductive portion 108 and the second conductive portion 109, and the first conductive portion 108 is electrically connected to the second conductive portion 109 through a via in the first insulating layer. The first insulating layer may be an inorganic layer, or an organic layer, or a stack of an inorganic layer and an organic layer. A second insulating layer is usually disposed on the side of the second conductive portion 109 away from the first conductive portion 108 to protect the first conductive portion 108 and the second conductive portion 109 from being oxidized and corroded. The second insulating layer may be an inorganic layer, or an organic layer, or a stack of an inorganic layer and an organic layer.

As illustrated in the figure, in the odd-numbered columns of sub-light-emitting regions in the N columns of sub-light-emitting regions (except the first column of sub-light-emitting regions), each column of sub-light-emitting regions comprises the driving voltage signal line VLEDL, the common voltage signal line GNDL, the power signal line PwrL, and the address selection signal line ADDRL, and they are sequentially arranged in the order of the driving voltage signal line VLEDL, the common voltage signal line GNDL, the power signal line PwrL, and the address selection signal line ADDRL from left to right along the second direction D2. In the even-numbered columns of sub-light-emitting regions in the N columns of sub-light-emitting regions, each column of sub-light-emitting regions comprises the driving voltage signal line VLEDL, the common voltage signal line GNDL, the power signal line PwrL, and the feedback signal line FBL, and they are sequentially arranged in the order of the driving voltage signal line VLEDL, the common voltage signal line GNDL, the power signal line PwrL, and the feedback signal line FBL from left to right along the second direction D2. It can be seen that in each column of sub-light-emitting regions, the common voltage signal line GNDL is arranged in the central area instead of the edge area of each column of sub-light-emitting regions, which can make the common voltage signal line GNDL have a large width along the second direction D2. Thereby, the voltage drop on the common voltage signal line GNDL can be reduced (e.g., to be lower than 0.5 V) without increasing the thickness of the common voltage signal line GNDL.

The driving circuits 107 in the two adjacent columns of sub-light-emitting regions are connected in series, so the two adjacent columns of sub-light-emitting regions can share one address selection signal line ADDRL and one feedback signal line FBL. Taking the adjacent first column of sub-light-emitting regions and the second column of sub-light-emitting regions as an example, the address selection signal line ADDRL is connected to the first-cascaded driving circuit 107 in the first column of sub-light-emitting regions. The driving circuits 107 in the first column of sub-light-emitting regions are cascaded in sequence, and the last-cascaded driving circuit 107 in the first column of sub-light-emitting regions is connected to the first-cascaded driving circuit 107 in the second column of sub-light-emitting regions. The driving circuits 107 in the second column of sub-light-emitting regions are also cascaded in sequence. Therefore, one address selection signal line ADDRL can provide address information for each driving circuit 107 in the first column of sub-light-emitting regions and the second column of sub-light-emitting regions. One feedback signal line FBL is connected to the last-cascaded driving circuit 107 in the second column of sub-light-emitting regions, so as to feed back the information of each driving circuit 107 in the first column of sub-light-emitting regions and the second column of sub-light-emitting regions to an external circuit (such as a flexible printed circuit).

As illustrated in the figure, the light-emitting substrate 400 further comprises a first signal line 103. The first portion 1031 of the first signal line 103 is located in the first area 1021 of the peripheral region 102 of the light-emitting substrate 400. Further, the first portion 1031 of the first signal line 103 is arranged between the first column of sub-light-emitting regions and the first side 001 of the light-emitting substrate 400. Each of the strip-like structures 1034 of the second portion 1032 of the first signal line 103 may be respectively arranged in a corresponding column of the $1^{st}$ to $X^{th}$ columns of sub-light-emitting regions, where $1 \leq X \leq N$. For example, when the second portion 1032 of the first signal line 103 comprises one strip-like structure 1034, X=1, and the one strip-like structure 1034 is arranged in the first column of sub-light-emitting regions. When the second portion 1032 of the first signal line 103 comprises three strip-like structures 1034, X=3, and the three strip-like structures 1034 are respectively arranged in the first column of sub-light-emitting regions, the second column of sub-light-emitting regions and the third column of sub-light-emitting regions. When the second portion 1032 of the first signal line 103 comprises N strip-like structures 1034, the N strip-like structures 1034 are respectively arranged in the $1^{st}$ to $N^{th}$ columns of sub-light-emitting regions. As illustrated in the figure, each strip-like structure 1034 is located at the rightmost in the corresponding column of sub-light-emitting regions. For example, the strip-like structure 1034 in the first column of sub-light-emitting regions is located at the rightmost in the first column of sub-light-emitting regions.

By making the first portion 1031 of the first signal line 103 be located in the first area 1021 of the peripheral region 102 and the second portion 1032 connected to the first portion 1031 of the first signal line 103 extend into the light-emitting region 101, the first portion 1031 of the first signal line 103 can be designed to have a narrow width in the second direction D2, for example, a width of 0.05-0.5 mm, so that it is beneficial to reduce the width of the first area 1021 along the second direction D2, that is, it is beneficial to narrow the width of the left frame of the light-emitting substrate 400. Since the second portion 1032 connected to the first portion 1031 extends into the light-emitting region 101, even if the width of the first portion 1031 of the first signal line 103 is reduced, due to the existence of the second portion 1032, the resistance and the voltage drop of the first signal line 103 will not be increased, so that the luminous efficiency of the light-emitting substrate 400 will not be affected, and the central area and the edge area of the light-emitting substrate 400 will have uniform luminance. In addition, with this arrangement, there is no need to increase the thickness of the first signal line 103, so the production cost can be reduced and the production efficiency can be improved.

Figure 11A:
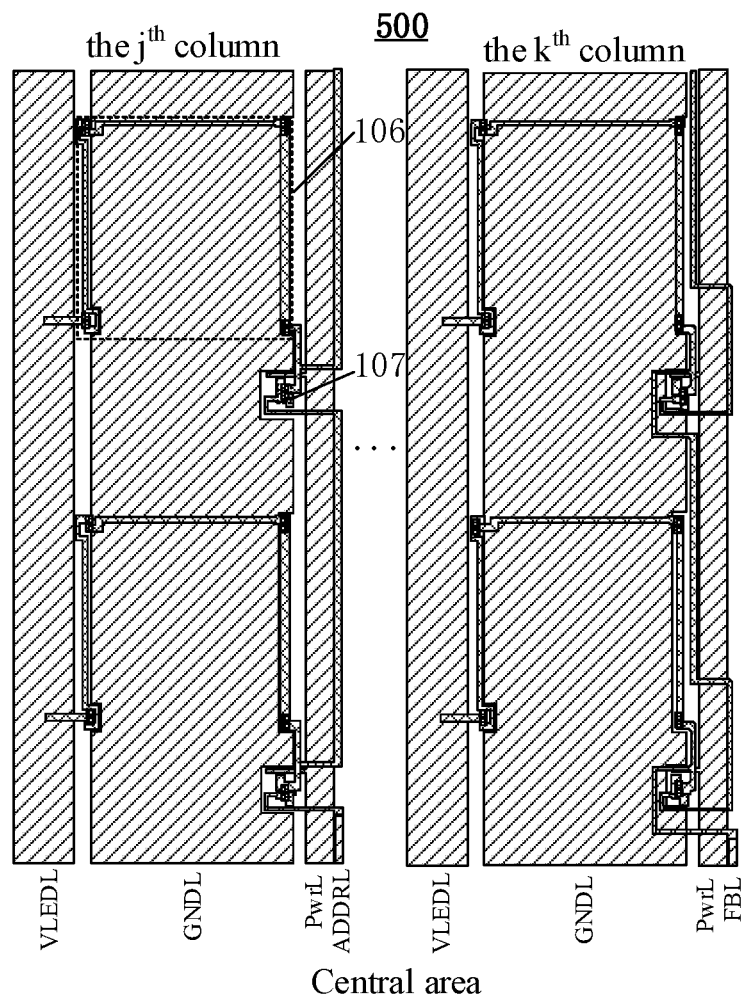
FIG. 11A illustrates a schematic diagram of the arrangement of the central area of a light-emitting substrate provided according to an embodiment of the present disclosure.
Figure 11B:
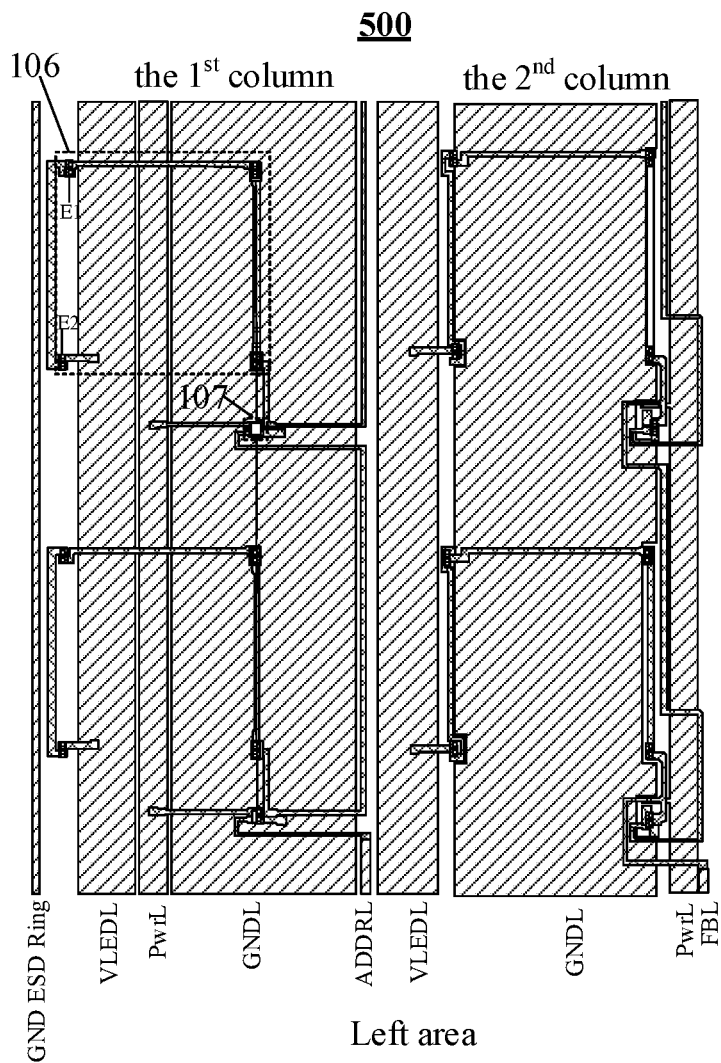
FIG. 11B illustrates a schematic diagram of the arrangement of the left area of a light-emitting substrate provided according to an embodiment of the present disclosure.
Figure 11C:
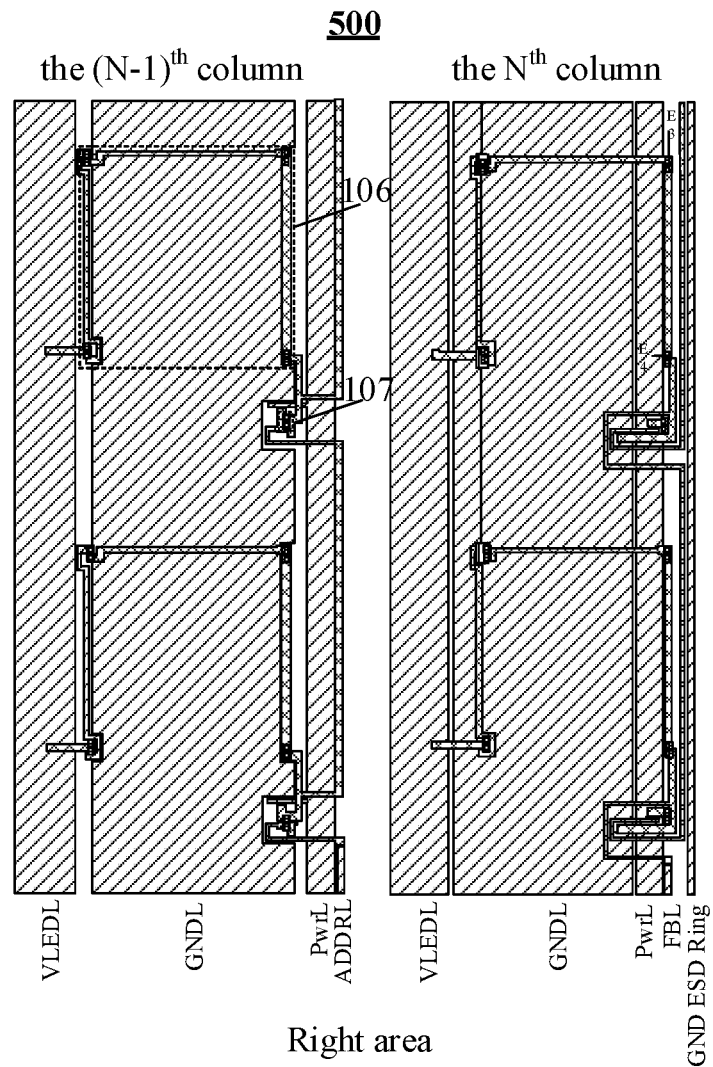
FIG. 11C illustrates a schematic diagram of the arrangement of the right area of a light-emitting substrate provided according to an embodiment of the present disclosure.

FIGS. 11A-11C illustrate another solution for reducing the width of the left frame and the right frame of a light-emitting substrate 500. The light-emitting substrate 500 has basically the same structure as the light-emitting substrate 400, that is, the first conductive portion 108 and the second conductive portion 109 are also located in different layers.

In the embodiment shown in FIGS. 11A-11C, the first signal line 103 comprises only the second portion 1032 but not the first portion 1031. The second portion 1032 is located in the light-emitting region 101. The second portion 1032 of the first signal line 103 comprises N sub-signal lines extending along the first direction D1, and each column of sub-light-emitting regions comprises one sub-signal line. It should be noted that the role of the second portion 1032 of the first signal line 103 here is different from that of the second portion 1032 of the first signal line 103 described in the previous embodiments. In the previous embodiments, the second portion 1032 is used as a tooth-like structure to form a "comb-like" structure together with the first portion 1031 and the third portion 1033, and the second portion 1032 is used to widen the width of the first portion 1031. However, in the embodiment with respect to FIGS. 11A-11C, the first signal line 103 comprises only the second portion 1032 but not the first portion 1031 and the third portion 1033, and the second portion 1032 located in the light-emitting region 101 comprises N sub-signal lines, and each column of sub-light-emitting regions comprises one sub-signal line. The N sub-signal lines are independent and insulated from each other, and are used to transmit corresponding electrical signals. The sub-signal lines may be the driving voltage signal line VLEDL, the power signal line PwrL, or the feedback signal line FBL. The specific types of the sub-signal lines will be introduced in more detail below.

As described with respect to FIG. 10, the adjacent two columns of sub-light-emitting regions are sequentially arranged in the order of the driving voltage signal line VLEDL, the common voltage signal line GNDL, the power signal line PwrL, the address selection signal line ADDRL, the driving voltage signal line VLEDL, the common voltage signal line GNDL, the power signal line PwrL and the feedback signal line FBL from left to right. In each column of sub-light-emitting regions, the driving voltage signal line VLEDL is located on the left side of the light-emitting unit 106. In the odd-numbered columns of sub-light-emitting regions, the power signal line PwrL and the address selection signal line ADDRL are located on the right side of the light-emitting unit 106; in the even-numbered columns of sub-light-emitting regions, the power signal line PwrL and the feedback signal line FBL are located on the right side of the light-emitting unit 106. If the N columns of sub-light-emitting regions are wired in the above-mentioned manner, then, a driving voltage signal line VLEDL with wide width is arranged between the center of the light-emitting units 106 in the first column of sub-light-emitting regions and the first side 001 of the light-emitting substrate 500 (i.e., the left frame area of the light-emitting substrate 500), a power signal line PwrL and a feedback signal line FBL are provided between the center of the light-emitting units 106 in the $N^{th}$ column of sub-light-emitting regions and the second side 002 of the light-emitting substrate 500 (i.e., the right frame area of the light-emitting substrate 500). This is not beneficial to the realization of a narrow frame of the light-emitting substrate 500, nor can it meet the requirements for optical and mechanical matching when the substrates are spliced.

In the example of FIGS. 11A-11C, as illustrated in FIG. 11A, the central area of the light-emitting substrate 500 maintains the above-mentioned wiring manner, that is, two adjacent columns of sub-light-emitting regions are sequentially arranged in the order of the driving voltage signal line VLEDL, the common voltage signal line GNDL, the power signal line PwrL, the address selection signal line ADDRL, the driving voltage signal line VLEDL, the common voltage signal line GNDL, the power signal line PwrL, and the feedback signal line FBL from left to right. The central area of the light-emitting substrate 500 may refer to the area occupied by the $j^{th}$~$k^{th}$ columns of sub-light-emitting regions of the light-emitting substrate 500, for example, $3 \leq j < k \leq N-2$.

The sub-signal line may refer to the driving voltage signal line VLEDL. In the $2^{nd}$ to $N^{th}$ columns of sub-light-emitting regions, the driving voltage signal line VLEDL is located on the side of the light-emitting unit 106 in each column of sub-light-emitting regions close to the first side 001 of the light-emitting substrate 500. In the first column of sub-light-emitting regions, the driving voltage signal line VLEDL is located on the side of the light-emitting elements E1 and E2 of the light-emitting units 106 in the column of sub-light-emitting regions away from the first side 001 of the light-emitting substrate 500. As shown in FIG. 11B, in the left area of the light-emitting substrate 500, the driving voltage signal line VLEDL in the first column of sub-light-emitting regions is arranged on the right side of the light-emitting elements E1 and E2, which are closest to the first side 001 of the light-emitting substrate 500, of the light-emitting unit 106, that is, the driving voltage signal line VLEDL in the first column of sub-light-emitting regions is located on the side of the light-emitting elements E1 and E2 in the column of sub-light-emitting regions away from the peripheral region, and the position of the power signal line PwrL is adjusted to be located between the driving voltage signal line VLEDL and the common voltage signal line GNDL. In this way, compared with the related art in which the driving voltage signal line VLEDL corresponding to the first column of sub-light-emitting regions is located in the left frame area of the light-emitting substrate (i.e., in the peripheral region), the driving voltage signal line VLEDL in the first column of sub-light-emitting regions of the embodiment of the present disclosure is adjusted from the peripheral region to the light-emitting region, and the light-emitting units 106 in the first column of sub-light-emitting regions are moved toward the first side 001 of the light-emitting substrate 500, so that the light-emitting units 106 in the first column of sub-light-emitting regions are closer to the first side 001 of the light-emitting substrate 500, the distance between the center of the light-emitting units 106 in the first column of sub-light-emitting regions and the first side 001 of the light-emitting substrate 500 is reduced, thereby reducing the width of the left frame of the light-emitting substrate 500.

The sub-signal lines may also refer to the power signal line PwrL and the feedback signal line FBL. In some columns of the first to $(N-1)^{th}$ columns of sub-light-emitting regions where the power signal line PwrL and the feedback signal line FBL need to be arranged (for example, the even-numbered columns of sub-light-emitting regions), the power signal line PwrL and the feedback signal line FBL are located on a side of the light-emitting unit 106 close to the second side 002 of the light-emitting substrate 500. In the $N^{th}$ column of sub-light-emitting regions, the power signal line PwrL and the feedback signal line FBL are located on a side of the light-emitting elements E3 and E4 of the light-emitting unit 106 in the column of sub-light-emitting regions away from the second side 002 of the light-emitting substrate 500. As illustrated in FIG. 11C, in the right area of the light-emitting substrate 500, the power signal line PwrL and the feedback signal line FBL in the Nth column of sub-light emitting regions are arranged on the left side of the light-emitting elements E3 and E4, which are closest to the second side 002 of the light-emitting substrate 500, of the light-emitting unit 106. In this way, compared to the related art in which the power signal line PwrL and the feedback signal line FBL corresponding to the Nth column of sub-light-emitting regions are located in the right frame area of the light-emitting substrate (i.e., in the peripheral region), the power signal line PwrL and the feedback signal line FBL in the Nth column of sub-light-emitting regions in the embodiment of the present disclosure are adjusted from the peripheral region to the light-emitting region, so that the light-emitting units 106 in the Nth column of sub-light-emitting regions move toward the second side 002 of the light-emitting substrate 500. Therefore, the light-emitting units 106 in the Nth column of sub-light-emitting regions are closer to the second side 002 of the light-emitting substrate 500. Thus, the distance between the center of the light-emitting units 106 in the Nth column of sub-light-emitting regions and the second side 002 of the light-emitting substrate 500 is reduced, and the width of the right frame of the light-emitting substrate 500 is reduced.

By optimizing the wiring of the driving voltage signal line VLEDL and the power signal line PwrL in the first column of sub-light-emitting regions of the light-emitting substrate 500, and optimizing the wiring of the power signal line PwrL and the feedback signal line FBL in the $N^{th}$ column of sub-light-emitting regions, the width of the left frame and the right frame of the light-emitting substrate 500 can be reduced, so that the light-emitting substrate 500 can be implemented as a narrow frame, and can meet the requirements for optical and mechanical matching during the splicing of the substrates.

It should be noted that although some signal lines (the driving voltage signal line VLEDL and the power signal line PwrL) in the first column of sub-light-emitting regions of the light-emitting substrate 500 have been adjusted in position, and some signal lines (the power signal line PwrL and the feedback signal line FBL) in the $N^{th}$ column of sub-light-emitting regions of the light-emitting substrate 500 have been adjusted in position, but the signal lines in the multiple columns of sub-light-emitting regions in the central area of the light-emitting substrate 500 have not been adjusted in position, corresponding technical means (such as adjusting the spacing between the signal lines) can be used to maintain the substantially same spacing between individual columns of sub-light-emitting regions of the light-emitting substrate 500.

The light-emitting substrate 400 in FIG. 10 and the light-emitting substrate 500 in FIGS. 11A-11C can also adopt the bonding electrodes 110 as described above, so that all signal lines are connected to the valid terminals 1101 of the bonding electrodes 110, thereby reducing the size of the lower frame of the light-emitting substrate 400 and the light-emitting substrate 500. For the specific arrangement, reference may be made to the foregoing description with respect to FIG. 7B, which is not repeated here for the sake of brevity.

A shielding ring GND ESD Ring is also illustrates in FIGS. 11B and 11C, and the shielding ring GND ESD Ring at least partially surrounds the periphery of the light-emitting region 101 to provide electrostatic shielding. Although not illustrated, the light-emitting substrate 100, the light-emitting substrate 200, the light-emitting substrate 300, and the light-emitting substrate 400 may also comprise the shielding ring GND ESD Ring. The shielding ring GND ESD Ring is connected to the valid terminal 1101 of the flexible printed circuit 110, and the flexible printed circuit 110 provides the same signal for the common voltage signal line GNDL and the shielding ring GND ESD Ring.

Figure 12:
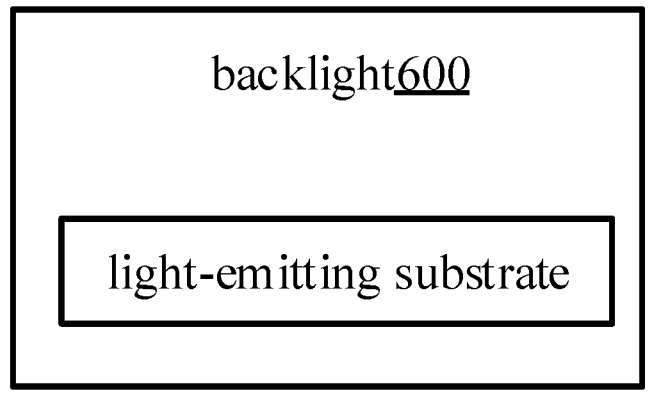
FIG. 12 illustrates a block diagram of a backlight provided according to an embodiment of the present disclosure.

According to another aspect of the present disclosure, a backlight is provided. FIG. 12 illustrates a block diagram of a backlight 600 comprising the light-emitting substrate described in any of the foregoing embodiments. The backlight 600 can be used as a backlight in a display device to provide a display light source for a display panel in the display device. Of course, the backlight 600 can also be used in any other device that requires a light source, and the embodiments of the present disclosure do not specifically limit the use of the backlight 600.

Since the backlight 600 may have substantially the same technical effects as the light-emitting substrates described in the previous embodiments, for the sake of brevity, the technical effects of the backlight 600 will not be repeated here.

Figure 13:
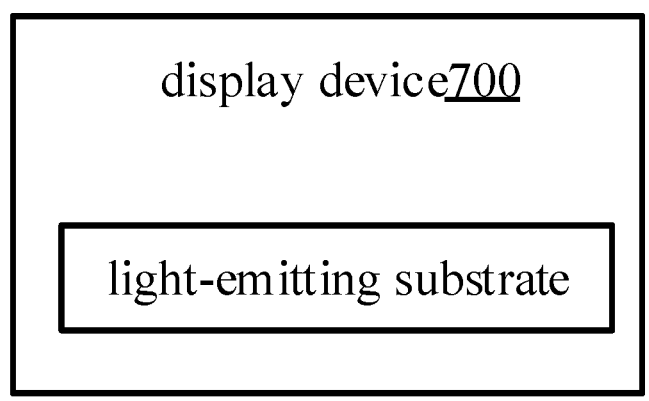
FIG. 13 illustrates a block diagram of a display device provided according to an embodiment of the present disclosure.

According to yet another aspect of the present disclosure, a display device is provided. FIG. 13 illustrates a block diagram of a display device 700 comprising the light-emitting substrate described in any of the foregoing embodiments. In some embodiments, the display device 700 may be a liquid crystal display device, which comprises a liquid crystal panel and a backlight disposed on a non-display side of the liquid crystal panel, the backlight comprising the light-emitting substrate described in any of the previous embodiments, for example the backlight can be used to implement HDR dimming for display operation. The liquid crystal display device can have more uniform backlight brightness and better display contrast. The display device 700 can be any suitable display device, comprising but not limited to any product or component with display function, such as mobile phone, tablet computer, television, displayer, notebook computer, digital photo frame, navigator, e-book, etc.

Since the display device 700 can have substantially the same technical effects as the light-emitting substrates described in the previous embodiments, for the sake of brevity, the technical effects of the display device 700 will not be described again here.

According to yet another aspect of the present disclosure, a method of manufacturing a light-emitting substrate is provided, which can be applied to the light-emitting substrate 200 and the light-emitting substrate 300 described above, that is, the first conductive portion 108 and the second conductive portion 109 are located in the same layer. The method may comprise the following steps.

First, the base substrate 111 is provided. The base substrate 111 may be any suitable substrate such as a plastic substrate, a silicon substrate, a ceramic substrate, a glass substrate, a quartz substrate, etc. The embodiments of the present disclosure do not limit the material of the base substrate 111.

Then, a buffer layer 112 is formed on the base substrate 111 by, for example, a magnetron sputtering method. The buffer layer 112 can be used to reduce the stress to the base substrate 111 when the first conductive portion 108 and the second conductive portion 109 are subsequently prepared, so as to avoid the bending deformation of the base substrate 111. The buffer layer 112 can also prevent the impurities in the base substrate 111 from adversely affecting the conductive performance of the first conductive portion 108 and the second conductive portion 109 formed subsequently. The buffer layer 112 may be any suitable material, for example, may be SiN.

Next, a conductive layer is formed on the buffer layer 112 by a magnetron sputtering method or an electroplating method, and the conductive layer is patterned to simultaneously form the first conductive portion 108, the second conductive portion 109, the first signal line 103 and the second signal line 104. The first conductive portion 108 may comprise the above-mentioned driving voltage signal line VLEDL, address selection signal line ADDRL, cascade wiring, power signal line VccL, data driving signal line DataL, common voltage signal line GNDL, feedback signal line FBL and optional shielding ring GND ESD Ring. The second conductive portion 109 comprises a first pad 1091 and a second pad 1092. The first pad 1091 is used for mounting the light-emitting unit 106, and the second pad 1092 is used for mounting the driving circuit 107. The first signal line 103 comprises a first portion 1031, a second portion 1032 and a third portion 1033. The second signal line 104 comprises a first portion 1041, a second portion 1042 and a third portion 1043. Since the thickness by a single magnetron sputtering generally does not exceed 1 μm, during manufacturing a conductive layer with a thickness exceeding 1 μm, multiple sputtering are usually required to form the conductive layer. In an example, the first conductive portion 108, the second conductive portion 109, the first signal line 103 and the second signal line 104 can be formed by the following process: firstly, a Cu layer with a thickness of 2 μm is formed on the buffer layer 112 to transmit various electrical signals; then a CuNi layer with a thickness of, for example, 0.6 μm is formed on the Cu layer, the CuNi layer can be used to protect the Cu layer and prevent the surface of the Cu layer with low resistivity from being exposed and oxidized. In another example, the first conductive portion 108, the second conductive portion 109, the first signal line 103 and the second signal line 104 may be formed by the following process: firstly, a MoNb layer with a thickness of about 300 Å is formed on the buffer layer 112, the MoNb layer is used to improve the adhesion between the layer and the base substrate 111; then a Cu layer is formed on the MoNb layer to transmit various electrical signals; finally, a MoNb layer with a thickness of about 200 Å is formed on the Cu layer to protect the intermediate Cu layer and prevent the surface of the intermediate Cu layer with low resistivity from being exposed and oxidized. When the first conductive portion 108, the second conductive portion 109, the first signal line 103 and the second signal line 104 are formed on the base substrate 111 by electroplating method, MoNiTi can be used to form a seed layer first to increase the nucleation density of metal grains in the subsequent electroplating process, and then a Cu layer with low resistivity is made by electroplating, and then an anti-oxidation layer is prepared, the material may be MoNiTi. The conductive layer can be cleaned, coated, baked, photolithographic, developed, hard baked, etched, stripped, etc. to form the first conductive portion 108, the second conductive portion 109, the first signal line 103 and the second signal line 104. To prepare the first conductive portion 108, the second conductive portion 109, the first signal line 103 and the second signal line 104 on the same layer, only two masks are required. Compared with the need for at least three masks to form conductive structures on different layers, the number of masks can be reduced, the manufacturing process can be simplified, and the production cost can be reduced.

Then, a first insulating layer 113 is formed on the side of the layer where the first conductive portion 108 and the second conductive portion 109 are located away from the base substrate 111 by a magnetron sputtering method. The first insulating layer 113 can be used to protect the first conductive portion 108 and the second conductive portion 109 from being oxidized and corroded by water, oxygen, etc. in the environment. The material of the first insulating layer 113 may be an organic material, an inorganic material, or a combination of an organic material and an inorganic material. The first insulating layer 113 may be a single layer, or may comprise multiple layers.

Optionally, a second insulating film layer may also be coated on the side of the first insulating layer 113 away from the base substrate 111, and the second insulating layer 114 is formed by performing several processes such as curing, exposing, developing, and etching to the second insulating film layer. The material of the second insulating layer 114 may be an organic material, an inorganic material, or a combination of an organic material and an inorganic material. The second insulating layer 114 may be a single layer, or may comprise multiple layers. When the second insulating layer 114 is formed on the light-emitting substrate, the second insulating layer 114 and the first insulating layer 113 are etched to form a plurality of vias.

Finally, the light-emitting substrate is cut into a predetermined shape, the light-emitting units 106 and the driving circuits 107 are electrically connected to the first pads 1091 and the second pads 1092 of the second conductive portion 109 through the above-mentioned plurality of vias, respectively, so as to mount the light-emitting units 106 and the driving circuits 107 on the corresponding pads. Each signal line of the first conductive portion 108 is connected to the flexible printed circuit 110 at the bonding area, so as to realize the electrical connection between the driving circuit 107 and the flexible printed circuit 110, and finally obtain the desired light-emitting substrate.

For other technical effects achieved by the method, reference may be made to the technical effects of the light-emitting substrate described in the previous embodiments. Therefore, for the sake of brevity, the technical effects of the method will not be repeated here.

In the figures, the thickness of regions and layers may be exaggerated for clarity. The same reference numerals in the figures denote the same or similar structures, and thus their detailed descriptions will be omitted. The described features, structures, or characteristics may be combined in any suitable manner in one or more embodiments. In the following description, numerous specific details are provided in order to give a thorough understanding of the embodiments of the present disclosure. However, one skilled in the art will appreciate that the technical solutions of the present disclosure may be practiced without one or more of the specific details, or other methods, components, materials, etc. may be employed. In other instances, well-known structures, materials, or operations are not shown or described in detail to avoid obscuring the main technical idea of the present disclosure.

Spatially relative terms such as "row", "column", "above", "below", "left", "right", etc. may be used herein for ease of description to describe the relationship of one element or feature to another element or feature as illustrated in the figures. It will be understood that these spatially relative terms are intended to encompass different orientations of the device in use or operation in addition to the orientation depicted in the figures. For example, if the device in the figures is turned over, the element described as "under other element or feature" or "below other element or feature" or "beneath other element or feature" would be oriented "above other element or feature", the element described as "on the left side of other element" would be oriented "on the right side of other element". Thus, the exemplary term "below" can encompass both the orientations of "above" and "below", and the exemplary term "on the left of" can encompass both the orientations of " on the left of" and "on the right of". The device may be otherwise oriented (rotated 90 degrees or at other orientations) and the spatially relative descriptors used herein are interpreted accordingly. In addition, it will also be understood that when a layer is referred to as being "between" two layers, it can be the only layer between the two layers, or one or more intervening layers may also be present.

In the description of this specification, description with reference to the terms "one embodiment," "another embodiment," etc. means that a particular feature, structure, material, or characteristic described in connection with the embodiment is comprised in at least one embodiment of the present disclosure. In this specification, the schematic representations of the above terms are not necessarily directed to the same embodiment or example. Furthermore, the particular feature, structure, material or characteristic described may be combined in any suitable manner in any one or more embodiments or examples. Furthermore, those skilled in the art may combine different embodiments or examples as well as the features in the different embodiments or examples described in this specification, without conflicting each other. In addition, it should be noted that in this specification, the terms "first" and "second" are only used for description purposes, and cannot be understood as indicating or implying relative importance or implicitly indicating the number of indicated technical features.

As those skilled in the art will understand, although the various steps of the methods of the present disclosure are depicted in the figures in a particular order, this does not require or imply that the steps must be performed in that particular order, unless the context clearly dictates otherwise. Additionally or alternatively, multiple steps may be combined into one step for execution, and/or one step may be decomposed into multiple steps for execution. Furthermore, other method steps may be inserted between the steps. The inserted steps may represent improvements to the method such as those described herein, or may be unrelated to the method. Also, a given step may not be fully completed before the next step begins.

The above descriptions are merely specific embodiments of the present disclosure, but the protection scope of the present disclosure is not limited thereto. Any person skilled in the art can easily think of changes or substitutions within the technical scope disclosed by the present disclosure, which should be comprised within the protection scope of the present disclosure. Therefore, the protection scope of the present disclosure should be based on the protection scope of the claims.

The invention claimed is:

1. A light-emitting substrate comprising a light-emitting region and a peripheral region surrounding the light-emitting region, wherein,
the peripheral region comprises a first area, the first area is between a first side of the light-emitting substrate and the light-emitting region, and
the light-emitting substrate further comprises a first signal line, the first signal line comprises a first portion and a second portion, the first portion of the first signal line extends along a first direction in the first area, the second portion of the first signal line extends into the light-emitting region, the first portion and the second portion of the first signal line are connected, the light-emitting region comprises a plurality of sub-light-emitting regions arranged in an array, and the second portion of the first signal line does not connect with a component of any one of the plurality of sub-light-emitting regions.

2. The light-emitting substrate according to claim 1, wherein,
the peripheral region further comprises a second area, the second area is between a second side of the light-emitting substrate opposite to the first side and the light-emitting region, and
the light-emitting substrate further comprises a second signal line, a first portion of the second signal line extends along the first direction in the second area, a second portion of the second signal line extends into the light-emitting region, and the first portion and the second portion of the second signal line are connected.

3. The light-emitting substrate according to claim 2, wherein,
the second portion of the first signal line comprises at least one strip-like structure extending along the first direction, the first portion and the second portion of the first signal line are connected via a third portion of the first signal line; and/or
the second portion of the second signal line comprises at least one strip-like structure extending along the first direction, the first portion and the second portion of the second signal line are connected via a third portion of the second signal line.

4. The light-emitting substrate according to claim 3, wherein the plurality of sub-light-emitting regions are arranged in M rows along the first direction and N columns along a second direction intersecting with the first direction, where M and N are both positive integers greater than or equal to 1,
the first portion of the first signal line is arranged between the first column of sub-light-emitting regions and the first side of the light-emitting substrate, and each of the at least one strip-like structure of the second portion of the first signal line is arranged in a corresponding column of $1^{st}$ to $X^{th}$ columns of sub-light-emitting regions,
each of the at least one strip-like structure of the second portion of the second signal line is arranged in a corresponding column of $Y^{th}$ to $N^{th}$ columns of sub-light-emitting regions, and the first portion of the second signal line is arranged between the $N^{th}$ column of sub-light-emitting regions and the second side of the light-emitting substrate, where $1 \leq X < Y \leq N$.

5. The light-emitting substrate according to claim 4, further comprising a first conductive portion on a same layer as the first signal line, wherein,
the first conductive portion comprises N−1 driving voltage signal lines extending along the first direction, each column of $2^{nd}$ to $N^{th}$ columns of sub-light-emitting regions comprises one driving voltage signal line, each of the plurality of sub-light-emitting regions comprises at least one light-emitting unit, in each column of the $2^{nd}$ to $N^{th}$ columns of sub-light-emitting regions, the driving voltage signal line is connected to a first end of each light-emitting unit in the column of sub-light-emitting regions, and,
the first portion of the first signal line is connected to the first end of each light-emitting unit in the first column of sub-light-emitting regions.

6. The light-emitting substrate according to claim 5, wherein a width of the first portion of the first signal line along the second direction is smaller than a width of each driving voltage signal line along the second direction.

7. The light-emitting substrate according to claim 5, further comprising a second conductive portion, wherein the second conductive portion comprises a plurality of pads, and a material of the first conductive portion and the second conductive portion comprises copper.

8. The light-emitting substrate according to claim 7, wherein the first conductive portion further comprises N−1 common voltage signal lines extending along the first direction, and the first conductive portion, the second conductive portion, and the second signal line are on a same layer,
each column of the $1^{st}$ to $(N-1)^{th}$ columns of sub-light-emitting regions comprises one common voltage signal line, each of the plurality of sub-light-emitting regions further comprises a driving circuit connected to a second end of the at least one light-emitting unit, in each column of the $1^{st}$ to $(N-1)$ th columns of sub-light-emitting regions, the common voltage signal line is connected to each driving circuit in the column of sub-light-emitting regions, and
the first portion of the second signal line is connected to each driving circuit in the $N^{th}$ column of sub-light-emitting regions.

9. The light-emitting substrate according to claim 8, wherein a width of the first portion of the second signal line along the second direction is smaller than a width of each common voltage signal line along the second direction.

10. The light-emitting substrate according to claim 8, wherein in each column of the $2^{nd}$ to $(N-1)^{th}$ columns of sub-light-emitting regions, the driving voltage signal line, the light-emitting unit, the driving circuit, and the common voltage signal line are sequentially arranged along the second direction.

11. The light-emitting substrate according to claim 10, wherein the first conductive portion further comprises N feedback signal lines extending along the first direction, and each column of sub-light-emitting regions comprises one feedback signal line,
in each column of sub-light-emitting regions, the driving circuits are cascaded in sequence, and the feedback signal line is connected to a last-cascaded driving circuit,
in at least some columns of the N columns of sub-light-emitting regions, the feedback signal line is on a side of the common voltage signal line away from the driving circuit, the common voltage signal line is in the same column of sub-light-emitting regions as the feedback signal line.

12. The light-emitting substrate according to claim 11, wherein, in each column of the $1^{st}$ to $X^{th}$ columns of sub-light-emitting regions, the feedback signal line is on the side of the common voltage signal line away from the driving circuit, the common voltage signal line is in the same column of sub-light-emitting regions as the feedback signal line, and in each column of the $Y^{th}$ to $X^{th}$ columns of sub-light-emitting regions, the feedback signal line is on a side of the driving voltage signal line away from the driving circuit, the driving voltage signal line is in the same column of sub-light-emitting regions as the feedback signal line.

13. The light-emitting substrate according to claim 8, further comprising a base substrate, a buffer layer and an insulating layer, wherein the buffer layer is between a layer where the first conductive portion and the second conductive portion are located and the base substrate, and the insulating layer is on a side of the layer where the first conductive portion and the second conductive portion are located away from the base substrate.

14. The light-emitting substrate according to claim 8, further comprising a bonding electrode in the peripheral region, wherein the bonding electrode comprises a valid terminal and a dummy terminal, the first portion and the second portion of the first signal line, the first portion and the second portion of the second signal line, and the first conductive portion are connected to the valid terminals of the bonding electrode.

15. The light-emitting substrate according to claim 14, wherein, the common voltage signal line comprises a first connection portion, the driving voltage signal line comprises a second connection portion, the common voltage signal line is connected to the valid terminal of the bonding electrode through the first connection portion, the driving voltage signal line is connected to the valid terminal of the bonding electrode through the second connection portion;

the first connection portion of the common voltage signal line in each column of the $1^{st}$ to $(N-1)^{th}$ columns of sub-light-emitting regions is only in the column of sub-light-emitting regions;

the second connection portion of the driving voltage signal line in each column of the $2^{nd}$ to $N^{th}$ columns of sub-light-emitting regions is only in the column of sub-light-emitting regions.

16. The light-emitting substrate according to claim 7, further comprising a base substrate, wherein the first conductive portion and the second conductive portion are in different layers, the first conductive portion is on the base substrate, and the second conductive portion is on a side of the first conductive portion away from the base substrate.

17. The light-emitting substrate according to claim 8, further comprising a shielding ring, wherein the shielding ring at least partially surrounds a periphery of the light-emitting region, and a signal received by the shielding ring is the same as a signal received by the common voltage signal line, and wherein each of the at least one light-emitting unit comprises a plurality of light-emitting elements connected to each other, each of the plurality of light-emitting elements comprises a sub-millimeter light emitting diode or a micro light emitting diode.

18. A backlight comprising the light-emitting substrate according to claim 1.

19. A display device comprising the light-emitting substrate according to claim 1.

* * * * *